(12) United States Patent
Sitti et al.

(10) Patent No.: US 8,142,700 B2
(45) Date of Patent: Mar. 27, 2012

(54) DRY ADHESIVES AND METHODS FOR MAKING DRY ADHESIVES

(75) Inventors: Metin Sitti, Pittsburgh, PA (US);
Michael Murphy, Waltham, ME (US);
Burak Aksak, Pittsburgh, PA (US)

(73) Assignee: Carnegie Mellon University, Pittsburgh, PA (US)

( * ) Notice: Subject to any disclaimer, the term of this patent is extended or adjusted under 35 U.S.C. 154(b) by 379 days.

(21) Appl. No.: 12/448,242

(22) PCT Filed: Dec. 14, 2007

(86) PCT No.: PCT/US2007/025683
§ 371 (c)(1),
(2), (4) Date: Aug. 27, 2009

(87) PCT Pub. No.: WO2008/076390
PCT Pub. Date: Jun. 26, 2008

(65) Prior Publication Data
US 2010/0021647 A1    Jan. 28, 2010

Related U.S. Application Data

(60) Provisional application No. 60/874,850, filed on Dec. 14, 2006.

(51) Int. Cl.
*B29C 37/02* (2006.01)
(52) U.S. Cl. ........... 264/139; 264/219; 264/220; 216/56
(58) Field of Classification Search ................. 264/139, 264/219, 220; 216/56
See application file for complete search history.

(56) References Cited

U.S. PATENT DOCUMENTS

| | | | |
|---|---|---|---|
| 6,722,026 B1 | 4/2004 | Lent | |
| 6,737,160 B1 | 5/2004 | Full et al. | |
| 6,872,439 B2 | 3/2005 | Fearing et al. | |
| 6,913,075 B1 | 7/2005 | Knowles et al. | |
| 7,011,723 B2 | 3/2006 | Full et al. | |
| 7,056,409 B2 | 6/2006 | Dubrow | |
| 7,074,294 B2 | 7/2006 | Dubrow | |
| 7,132,161 B2 | 11/2006 | Knowles et al. | |
| 7,144,624 B2 | 12/2006 | Knowles et al. | |
| 7,175,723 B2 | 2/2007 | Jones et al. | |

(Continued)

FOREIGN PATENT DOCUMENTS
WO   WO 2005/026042 A   3/2005

OTHER PUBLICATIONS

Autumn, Kellar, et al, "Adhesive force of a single gecko foot-hair", Nature, vol. 405, Jun. 8, 2000, pp. 681-685.

(Continued)

*Primary Examiner* — Joseph Del Sole
*Assistant Examiner* — James Sanders
(74) *Attorney, Agent, or Firm* — Peter J. Borghetti; David G. Oberdick

(57) ABSTRACT

Dry adhesives and methods for forming dry adhesives. A method of forming a dry adhesive structure on a substrate, comprises: forming a template backing layer of energy sensitive material on the substrate; forming a template layer of energy sensitive material on the template backing layer; exposing the template layer to a predetermined pattern of energy; removing a portion of the template layer related to the predetermined pattern of energy, and leaving a template structure formed from energy sensitive material and connected to the substrate via the template backing layer.

15 Claims, 18 Drawing Sheets

U.S. PATENT DOCUMENTS

| | | |
|---|---|---|
| 7,229,685 B2 | 6/2007 | Full et al. |
| 7,279,916 B2 | 10/2007 | Suhir |
| 7,632,417 B2 | 12/2009 | Suh et al. |
| 2003/0124312 A1 | 7/2003 | Autumn |
| 2003/0209642 A1 | 11/2003 | Fontana et al. |
| 2004/0076822 A1 | 4/2004 | Jagota et al. |
| 2005/0038498 A1 | 2/2005 | Dubrow et al. |
| 2005/0072509 A1 | 4/2005 | Full et al. |
| 2005/0119640 A1 | 6/2005 | Sverduk et al. |
| 2005/0148984 A1 | 7/2005 | Lindsay et al. |
| 2005/0151385 A1 | 7/2005 | Autumn et al. |
| 2005/0181170 A1 | 8/2005 | Fearing et al. |
| 2005/0181629 A1 | 8/2005 | Jagota et al. |
| 2005/0221072 A1 | 10/2005 | Dubrow et al. |
| 2005/0224975 A1 | 10/2005 | Basavanhally et al. |
| 2005/0271869 A1 | 12/2005 | Jackson |
| 2005/0271870 A1 | 12/2005 | Jackson |
| 2006/0005362 A1 | 1/2006 | Arzt et al. |
| 2006/0078725 A1 | 4/2006 | Fearing et al. |
| 2006/0097252 A1 | 5/2006 | Basavanhally et al. |
| 2006/0131265 A1 | 6/2006 | Samper et al. |
| 2006/0165952 A1 | 7/2006 | Dubrow |
| 2006/0202355 A1 | 9/2006 | Majidi et al. |
| 2006/0204738 A1 | 9/2006 | Dubrow et al. |
| 2006/0213599 A1 | 9/2006 | Knowles et al. |
| 2008/0073323 A1 | 3/2008 | Full et al. |

OTHER PUBLICATIONS

Autumn, Kellar, et al, "Evidence for van der Waals adhesion in gecko setae", PNAS, Sep. 17, 2002, vol. 99, No. 19, pp. 12252-12256.

Arzt, Eduard, et al, "From micro to nano contacts in biological attachment devices", PNAS, Sep. 16, 2003, vol. 100, No. 19, pp. 10603-10606.

Geim, A.K., et al, "Microfabricated adhesive mimicking gecko foot-hair", Nature Materials, 2, Jun. 1, 2003, pp. 1-3.

Sitti, Metin, et al, "Synthetic Gecko Foot-Hair Micro/Nano-Structures as Dry Adhesives", Journal of Adhesion Science and Technology, 2008, 17 (5), pp. 1-8.

Gao, Huajian, et al, "Shape insensitive optimal adhesion of nanoscale fibrillar structures", PNAS, May 25, 2004, vol. 101, No. 21, pp. 7851-7856.

Glassmaker, N. J., et al, "Design of biomimetic fibrillar interfaces: 1. Making contact", J. R. Soc. Lond. Interface, 2004, pp. 1-10.

Hui, C.-Y., "Design of biomimetic fibrillar interfaces: 2. Mechanics of enhanced adhesion", J. R. Soc. Lond. Interface, 2004, pp. 1-14.

Hung, Kuo-Yung, et al, "Application of 3D glycerol-compensated inclined-exposure technology to an integrated optical pick-up head", J. Micromech. Microeng. 14, 2004, pp. 975-983.

Menon, Carlo, et al, "Gecko Inspired Surface Climbing Robots", WaalBot, Robio04, vol. 6, 2004, pp. 1-6.

Chung, Jun Young, et al, "Roles of discontinuities in bio-inspired adhesive pads", J. R. Soc. Interface, 2005, 2, pp. 55-61.

Crosby, Alfred J., et al, "Controlling Polymer Adhesion with "Pancakes"", Langmuir, vol. 21, No. 25, 2005, pp. 11738-11743.

Hansen, W. R., et al, "Evidence for self-cleaning in gecko setae", PNAS, Jan. 11, 2005, vol. 102, No. 2, pp. 385-389.

Huber, Gerrit, et al, "Evidence for capillarity contributions to gecko adhesion from single spatula nanomechanical measurements", PNAS, Nov. 8, 2005, vol. 102, No. 45, pp. 16293-16296.

Northen, Michael T., et al, "A batch fabricated biomimetic dry adhesive", Nanotechnology, 2005, 16, pp. 1159-1166.

Spolenak, Ralph, et al, "Effects of contact shape on the scaling of biological attachments", Proc. R. Soc. A, 2005, 461, pp. 305-319.

Sun, Wanxin, et al, "The Nature of the Gecko Lizard Adhesive Force", Biophysical Journal: Biophysical Letters, 2005, pp. L14-L17.

Autumn, K., et al, "Frictional adhesion: a new angle on gecko attachment", The Journal of Experimental Biology, 2006, 209, pp. 3569-3579.

Kim, Seok, et al, "Biologically inspired polymer microfibers with spatulate tips as repeatable fibrillar adhesives", Applied Physics Letters, 2006, 89, pp. 261911-1-261911-3. See www.apl.aip.org/apl/copyright.jsp.

Varenberg, M., et al, "Effect of real contact geometry on adhesion", Applied Physics Letters, 2006, 89, pp. 121905-1-121905-3. See www.apl.aip.org/apl/copyright.jsp.

Aksak, Burak, et al, "Adhesion of Biologically Inspired Vertical and Angled Polymer Microfiber Arrays", Langmuir, 23, 2006, pp. A-K.

Del Campo, Aranzazu, et al, "Design Parameters and Current Fabrication Approaches for Developing Bioinspired Dry Adhesives", Macromol. Biosci., 2007, 7, pp. 118-127.

Glassmaker, Nicholas J., et al, "Biologically inspired crack trapping for enhanced adhesion", PNAS, Jun. 26, 2007, vol. 104, No. 26, pp. 10786-10791.

Greiner, Christian, et al, "Adhesion of Bioinspired Micropatterned Surfaces: Effects of Pillar Radius, Aspect Ratio, and Preload", Langmuir, 23, 2007, pp. A-H.

Majidi, Carmel, et al, "Clumping and Packing of Hair Arrays Manufactured by Nanocasting", Proc. of the International Mech. Eng. Congress and Exposition ASME, 2004, pp. 1-6.

Persson, B. N. J., "On the mechanism of adhesion in biological systems", Journal of Chemical Physics, Apr. 22, 2003, vol. 118, No. 16, pp. 7614-7621.

Shull, Kenneth R., "Contact mechanics and the adhesion of soft solids", Materials Science and Engineering, 2002, pp. 1-45.

Tang, Tian, et al, "Can a fibrillar interface be stronger and tougher than a non-fibrillar one?", J. R. Soc. Interface, 2005, 2, pp. 505-516.

Yurdumakan, Betul, et al "Synthetic gecko foot-hairs from multiwalled carbon nanotubes", Chem. Commun., 2005, pp. 3799-3801.

Zhao, Yang, et al, "Interfacial energy and strength of multiwalled-carbon-nanotube-based dry adhesive", J. Vac. Sci. Technol. B, Microelectronics and Nanometer Structures, vol. 24, No. 1, Jan./Feb. 2006, p. 331-335.

Perrson, B.N.J., et al., "The effect of surface roughness on the adhesion of Elastic Plates with application to biological systems", J. Chem. Phys., 119(21), pp. 11437-11444, 2003.

Autumn, K. et al., "Effective elastic modulus of isolated gecko setal arrays", J Exp. Bio., 209, pp. 3558-3568 (2006).

Bogdanov A.L., et al., "Use of SU-8 photoresist for very high aspect ratio x-ray lithography", Elsevier Science B.V., Microelectronic Engineering, 53 (2000), pp. 493-496.

Shew, Bor-Yuan et al., "High resolution x-ray micromachining using SU-8 resist", Journal of Micromechanics and Microengineering, 13 (2003), pp. 708-713. www.stacks.iop.org/JMM/13/708.

Johnson, K.L., "Surface Energy and the Contact of Elastic Solids", Proceedings of the Royal Society of London, Series A, Mathematical and Physical Sciences, vol. 32, No. 1558 (Sep. 8, 1971), pp. 301-313.

Ayon, A. A., et al., "Characterization of a Time Multiplexed Inductively Coupled Plasma Etcher", Journal of the Electrochemical Society, 1999, 146 (1) 339-349.

Form PCT/ISA/220, PCT Notification of Transmittal of the International Search Report and the Written Opinion for PCT/US2007/025683, Date Mailed Aug. 12, 2008.

Form PCT/ISA/210, PCT International Search Report for International Application No. PCT/US2007/025683, Date Mailed Aug. 12, 2008.

Form PCT/ISA/237, PCT Written Opinion of the International Searching Authority for International Application No. PCT/US2007/025683, Date Mailed Aug. 12, 2008.

Form PCT/IPEA/416, PCT Notification of Transmittal of the Int'l Preliminary Report on Patentability for Int'l Appln No. PCT/US2007/025683, Date Mailed Jan. 9, 2009.

Form PCT/IPEA/409, PCT International Preliminary Report on Patentability for Int'l Appln No. PCT/US2007/025683, Date Mailed Jan. 9, 2009.

Mata, A., et al., "Fabrication of multi-layer SU-8" Journal of Micromechanics and Microengineering, [Online] Jan. 9, 2006, pp. 276-284, XP002490572.

Peterman, M.C., et al., "Building thick photoresist structures from the bottom up", Journal of Micrimechanics and Microengineering, [Online] Feb. 28, 2003, pp. 380-382, XP002490573.

Fearing, R., "Gecko Adhesion Bibliography" [Online] Jan. 2008, pp. 1-8, XP002490287.

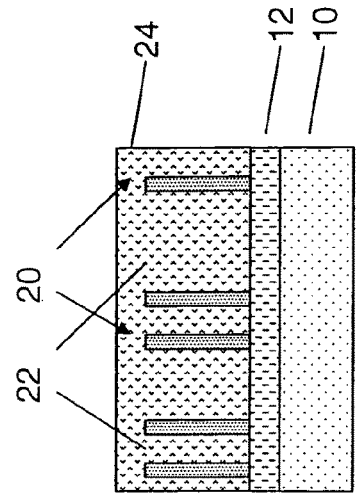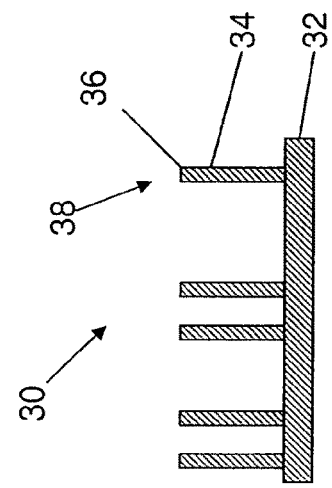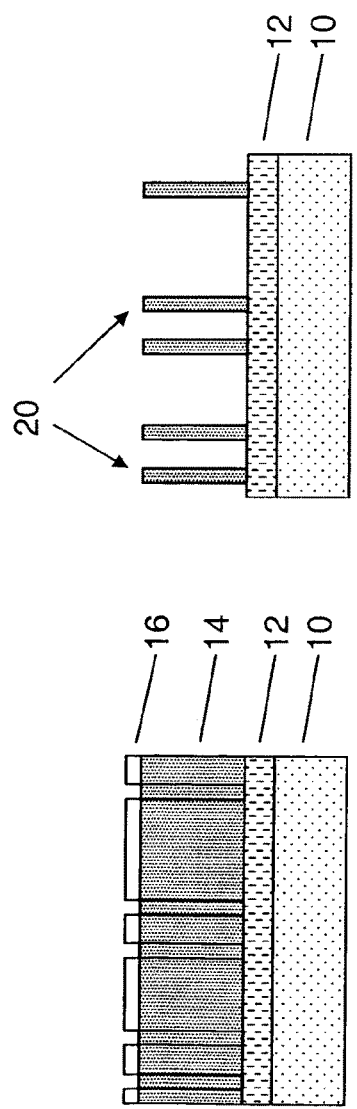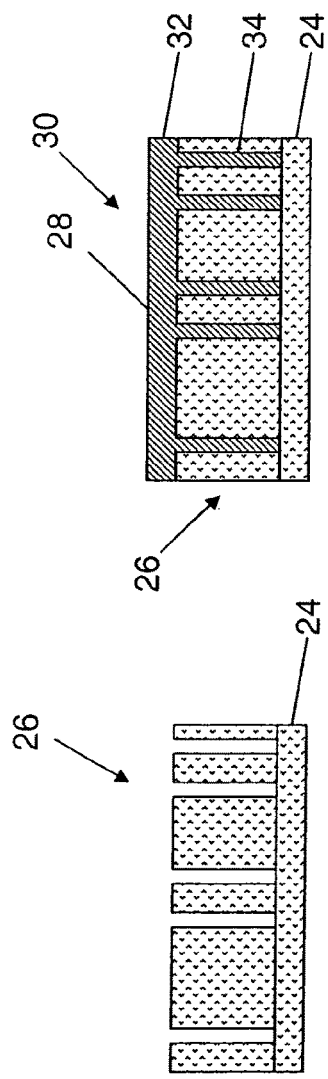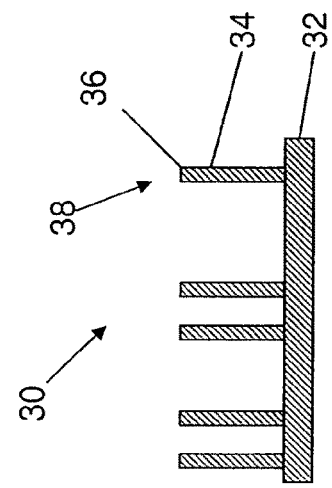

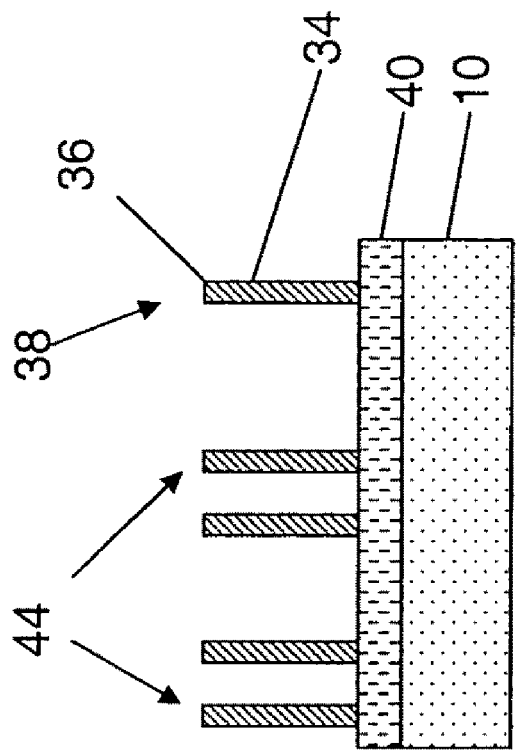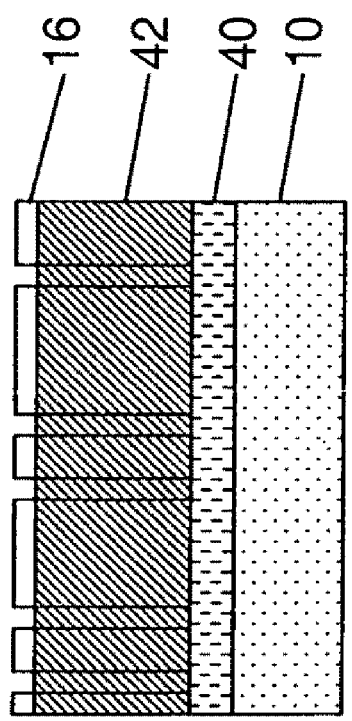

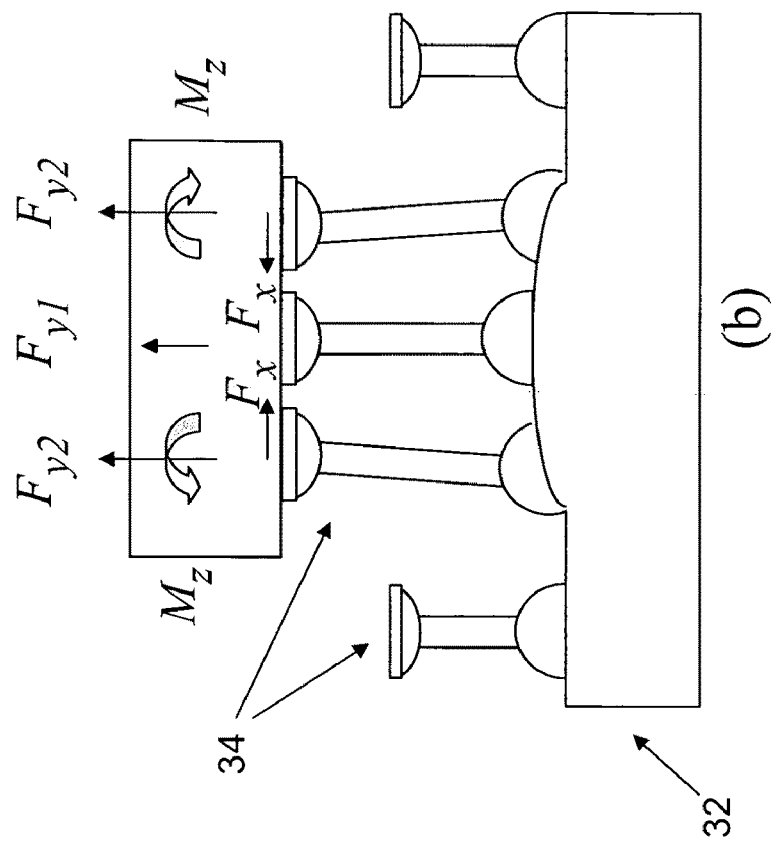
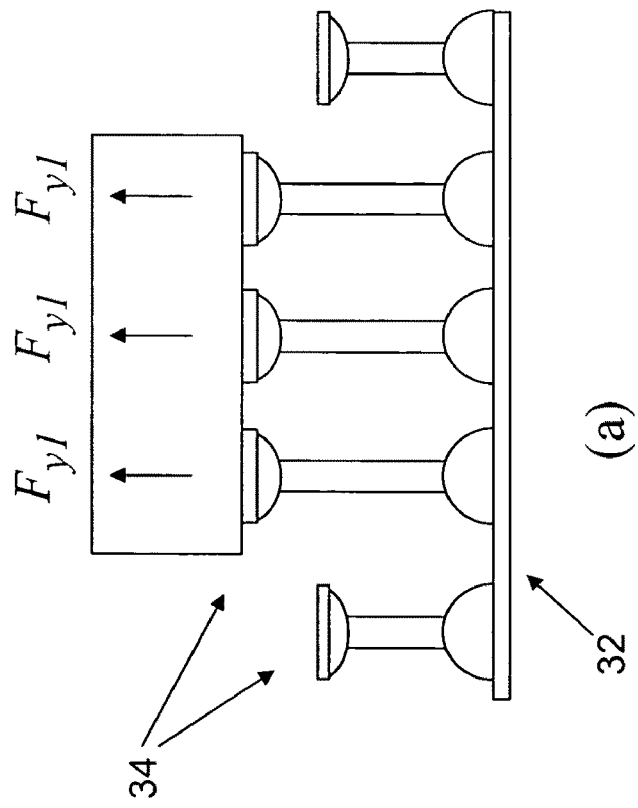
FIG. 15

DRY ADHESIVES AND METHODS FOR MAKING DRY ADHESIVES

CROSS-REFERENCE TO RELATED APPLICATIONS

This application claims priority from International application number PCT/US2007/025683, filed Dec. 14, 2007, which claims priority from U.S. Provisional Patent Application No. 60/874,850, filed Dec. 14, 2006 and which are incorporated herein by reference. This application is related to U.S. patent application Ser. Nos. 12/448,243, filed Jun. 12, 2009, 12/562,643, filed Sep. 18, 2009, and 12/562,683, filed Sep. 18, 2009.

STATEMENT REGARDING FEDERALLY-SPONSORED RESEARCH AND DEVELOPMENT

This invention was made, in part, with government support under Grant Number CNS-0428738 awarded by the National Science Foundation. The United States government may have certain rights in this invention.

FIELD OF THE INVENTION

The present invention relates to dry adhesives, and methods for making dry adhesives including, for example, fibrillar microfibers and nanofibers.

BACKGROUND OF THE INVENTION

Fibrillar adhesives on the feet of geckos and spiders and other animals have been of great interest because they can repeatedly attach to wide range of surfaces with a controllable adhesion strength in various environments including vacuum, and leave no residue. Furthermore, fibrillar adhesives are self-cleaning which allows for long lifetime and repeated use without significant performance degradation [W. Hansen and K. Autumn. Evidence for self-cleaning in gecko setae. *Proceedings of the National Academy of Sciences*, 102:385-389, 2005.]. These foot-hairs conform to the surface roughness to increase the real contact area, resulting in high adhesion by surface forces [K. Autumn, Y. A. Liang, S. T. Hsieh, W. Zesch, W. P. Chan, T. W. Kenny, R. Fearing, and R. J. Full. Adhesive force of a single gecko foot-hair. *Nature*, 405:681-685, 2000.]. This adhesion, called dry adhesion, is argued to arise from molecular surface forces such as van der Waals forces [K. Autumn, M. Sitti, Y. A. Liang, A. M. Peattie, W. R. Hansen, S. Sponberg, T. W. Kenny, R. Fearing, J. N. Israelachvili, and R. J. Full. Evidence for van der waals adhesion in gecko setae. *Proceedings of the National Academy of Sciences*, 99:12252-56, September 2002.], [K. Autumn, Y. A. Liang, S. T. Hsieh, W. Zesch, W. P. Chan, T. W. Kenny, R. Fearing, and R. J. Full. Adhesive force of a single gecko foot-hair. *Nature*, 405:681-685, 2000.], possibly in combination with capillary forces [G. Huber, H. Mantz, R. Spolenak, K. Mecke, K. Jacobs, S. N. Gorb, and E. Arzt. Evidence for capillarity contributions to gecko adhesion from single spatula nanomechanical measurements. *Proceedings of the National Academy of Sciences*, 102: 16293-16296, 2005.], [V. Sun, P. Neuzil, T. Kustandi, S. Oh, and V. D. Samper. The nature of the gecko lizard adhesive force. *Biophysical Journal: Biophysical Letters*, L14-L17, 2005.]. The complexity of the structure of these fibers differs among the species of animal. For large lizards such as the Tokay gecko the fibers take on a complicated branched structure, whereas for lighter animals such as spiders and anoles the structure is a simple array of angled high aspect ratio microfibers [E. Arzt, S. Gorb, and R. Spolenak. From micro to nano contacts in biological attachment devices. *Proceedings of the National Academy of Sciences*, 100(19):10603-06, September 2003.]. Some Gecko species have adhesion strength capabilities as high as 100 kPa [K. Autumn, Y. A. Liang, S. T. Hsieh, W. Zesch, W. P. Chan, T. W. Kenny, R. Fearing, and R. J. Full. Adhesive force of a single gecko foot-hair. *Nature*, 405:681-685, 2000.]. In Geckos, the oriented fibers are made of a stiff biomaterial (beta-keratin) with a Young's modulus of approximately 4 GPa [B. N. J. Persson. On the mechanism of adhesion in biological systems. *Journal of Chemical Physics*, 118:7614-7621, April 2003.] and have diameters from 0.2 to 5 µm [E. Arzt, S. Gorb, and R. Spolenak. From micro to nano contacts in biological attachment devices. *Proceedings of the National Academy of Sciences*, 100(19):10603-06, September 2003.]. The structure and material properties such as Young's modulus allow the fibers to individually bend and adapt to a wide variety of surface roughnesses and also to return to their original shape after release from the surface. Fabrication of similar synthetic structures would enable the production of long-lifetime reusable fibrillar adhesives with broad applications.

The enhanced adhesion from fibrillar surfaces has been studied and described in terms of fracture mechanics, elastic beam theory, and surface interaction forces [A. Crosby, M. Hageman, and A. Duncan, Controlling polymer adhesion with "pancakes", *Langmuir,* 21:11738-11743, 2005.], [T. Tang, C.-Y. Hui, and N. J. Glassmaker, Can a fibrillar interface be stronger and tougher than a non-fibrillar one? *Journal of The Royal Society, Interface,* 2(5):505-516, 2005.], [C. Hui, N. J. Glassmaker, T. Tang, and A. Jagota. Design of biomimetic fibrillar interfaces: 2. mechanics of enhanced adhesion, *Journal of The Royal Society, Interface,* 1:35-48, 2004.], [B. N. J. Perrson and S. Gorb. The effect of surface roughness on the adhesion of elastic plates with application to biological systems. *Journal of Chemical Physics,* 119(21): 11437-11444, 2003.], [B. N. J. Persson. On the mechanism of adhesion in biological systems, *Journal of Chemical Physics,* 118:7614-7621, April 2003.], [N. J. Glassmaker, A. Jagota, C.-Y. Hui, and J. Kim. Design of biomimetic fibrillar interfaces: 1. making contact. *Journal of The Royal Society, Interface,* 1(1):23-33, November 2004.], [J. Y. Chung and M. K. Chaudhury. Roles of discontinuities in bioinspired adhesive pads. *Journal of The Royal Society Interface,* 2:55-61, 2005.], including analysis of the effects of tip shape and fiber size [R. Spolenak, S. Gorb, H. Gao, and E. Arzt. Effects of contact shape on the scaling of biological attachments, *Proceedings of the Royal Society A,* 461:305-319, 2005.], [H. Gao and H. Yao. Shape insensitive optimal adhesion of nanoscale fibrillar structures. *Proceedings of the National Academy of Sciences,* 101(21):7851-7856, May 2004.]. Work has also been conducted to create synthetic fiber adhesives via various fabrication techniques. Since van der Waal's forces are universal, a wide variety of materials and techniques may be used to construct the fibers. Methods such as electron-beam lithography (A. K. Geim, S. V. Dubonos, I. V. Grigorieva, K. S. Novoselov, A. A. Zhukov, and S. Y. Shapoval. Microfabricated adhesive mimicking gecko foot-hair. *Nature Materials,* 2:461-463, 1 Jun. 2003.], micro/nanomolding [N. J. Glassmaker, A. Jagota, C.-Y Hui, and J. Kim. Design of biomimetic fibrillar interfaces: 1. making contact. *Journal of The Royal Society, Interface,* 1(1):23-33, November 2004.], [M. Sitti and R. Fearing. Synthetic gecko foot-hair micro/nano-structures as dry adhesives, *Journal of Adhesion Science and Technology,* 17(58):1055-741073, May 2003.], [C. Majidi, R. Groff, and R. Fearing, Clumping and packing of hair arrays manufactured by nanocasting, *Proc. of the ASME International Mechanical Engineering Congress and Exposition,* pages 1-6, 2004.], [C. Menon, M. Murphy, and M. Sitti. Gecko inspired surface climbing robots, *Proc. of the IEEE Int. Conf. on Robotics and Biomimetics,* pages 431-436, August 2004.], and self-assembly are employed to fabricate fibers from polymers [K. Autumn, M. Sitti, Y. A. Liang, A. M. Peattie, W. R. Hansen, S. Sponberg, T. W. Kenny, R. Fearing, J. N. Israelachvili, and R. J. Full. Evidence for van der waals adhesion in gecko setae, *Proceedings of the National Academy of Sciences,* 99:12252-56, September 2002.], [M. Sitti and R. Fearing. Synthetic gecko foot-hair micro/nanostructures as dry adhesives. *Journal of Adhesion Science and Technology,* 17(5):1055-1073, May 2003.], polymer organorods [M. T. Northen and K. L. Turner, A batch fabricated biomimetic dry adhesive. *Nanotechnology,* 16: 1159-1166, 2005.], and multi-walled carbon nanotubes [Yo Zhao, T. Tong, L. Delzeit, A. Kashani, M. Meyyappan, and A. Majumdar. Interfacial energy and strength of multiwalled-carbon-nanotube-based dry adhesive. *Journal of Vacuum Science & Technology B: Microelectronics and Nanometer Structures,* 24:331-335, 2006.], [B. Yurdumakan, N. R. Raravikar, P. M. Ajayanb, and A. Dhinojwala. Synthetic gecko foot-hairs from multiwalled carbon nanotubes. *Chemical Communications,* pages 3799-3801, 2005.].

U.S. Pat. No. 6,872,439 describes a variety of methods for the fabrication of microfibers, including the fabrication of angled microfibers. The methods include the fabrication of negative templates by using substrates with fabricated or self-organized high aspect ratio holes. These holes can be made by imprinting the desired shape using single sharp probes, or by using optical lithography, deep reactive ion etching (DRIE) with thermal oxidization processing, black silicon etching, laser micro/nanomachining, electron-beam lithography, nano-imprinting, or soft-lithography. A second approach is through the use of a positive template that is fabricated by molding already existing or fabricated high aspect ratio stiff micro/nano-structures that are not appropriate to use directly as synthetic hair. These micro/nano structures, for instance, could be carbon nanotubes, nanowires, or nanorods.

Several methods are disclosed to achieve oriented fibers. First, a soft surface, such as wax, may be indented by a sharp probe at an angle. Another method is to shear a molded template under stress and at a specific temperature to plastically deform it to a desired angle θ.

U.S. patent application Ser. No. 10/863,129 (published as US 2005-0271869 A1) and Ser. No. 10/982,324 (published as US 2005-0271870 A1) disclose a method for forming hierarchical structures of microfibers with smaller microfibrils attached to the end. In one embodiment, these applications describe a method to fabricate nanostructures that are angled. This method relies on the insertion of oriented fibers into a liquid polymer which is then cross-linked to provide a final microfiber embedded substrate. Smaller microfibrils are then microimprinted or attached to the top surface of this substrate. Fabrication of aligned microfibrils with controlled density and embedding them inside a polymer matrix are not described.

The microfiber fabrication methods described above are very expensive for producing commercial quantities of adhesive materials. Moreover, they cannot efficiently and controllably produce angled fibers. Adhesion and overall work of adhesion of the microfiber arrays are measured and compared with the models to observe the effect of fiber geometry and preload.

Accordingly, there is a need for improved dry adhesives and improved methods for making dry adhesives. In particular, there is a need for dry adhesives having greater adhesive forces and improved durability. In addition, there is a need for methods of making dry adhesives with lower costs of production. Those and other advantages of the present invention will be described in more detail hereinbelow.

BRIEF SUMMARY OF THE INVENTION

The present invention provides a method for the fabrication of polymer microfiber arrays with precisely controlled geometry and density through a micromolding process which duplicates lithographically formed master template structures with a desired fiber material. This technique enables fabrication of fiber array patches inexpensively and with high yields. This is a significant advantage with compared to other proposed fibrillar adhesive fabrication techniques [A. K. Geim, S. V. Dubonos, I. V. Grigorieva, K. S. Novoselov, A. A. Zhukov, and S. Y. Shapoval. Microfabricated adhesive mimicking gecko foot-hair. *Nature Materials,* 2:461-463, 1 Jun. 2003.], [M. T. Northen and K. L. Turner. A batch fabricated biomimetic dry adhesive. *Nanotechnology,* 16:1159-1166, 2005.], [Y. Zhao, T. Tong, L. Delzeit, A. Kashani, M. Meyyappan, and A. Majumdar. Interfacial energy and strength of multiwalled-carbon-nanotube-based dry adhesive. *Journal of Vacuum Science 4 Technology B: Microelectronics and Nanometer Structures,* 24:331-335, 2006.]. Also, this method allows for design and fabrication of fibers with non-vertical orientation.

The present invention provides methods for fabrication of vertical and angled micro- and nanofibers with adhesive qualities. Polymer micro- and nanofiber arrays are fabricated through a micro molding process which duplicates lithographically formed master template structures with a desired fiber material. This technique enables fabrication of fiber arrays inexpensively and with high yields, and enables the fabrication of fibers with controlled angles.

Many other variations are possible with the present invention. For example, different materials may be used to make the fibers and the dry adhesive, and the geometry and structure of the fibers and the dry adhesive may vary. In addition, different types of etching and other material removal processes, as well as different deposition and other fabrication processes may also be used. These and other teachings, variations, and advantages of the present invention will become apparent from the following detailed description of the invention.

BRIEF DESCRIPTION OF THE FIGURES

Embodiments of the present invention will now be described, by way of example only, with reference to the accompanying drawings for the purpose of illustrating the embodiments, and not for purposes of limiting the invention, wherein:

FIGS. 1a-1f illustrate one embodiment of the method according to the present invention.

FIGS. 2a and 2b illustrate another embodiment of the method according to the present invention.

In FIG. 5(a), a thin layer of SU-8 is spun on a glass substrate then exposed and cured; in FIG. 5(b), a thicker layer of SU-8 is spun which will become the fibers; in FIG. 5(c), the thick layer is patterned with UV exposure; and in FIG. 5(d), the SU-8 photoresist is developed, leaving the desired fiber array.

FIG. 8 illustrates optical microscope profile view image frames from a typical measurement showing 25 µm diameter long angled ST-1060 polyurethane fibers with a line overlayed on the edge of the glass hemisphere for clarity, wherein FIG. 8(a) illustrates before contact with the glass hemisphere, wherein FIG. 8(b) illustrates fibers during compression without loss of tip contact, wherein FIG. 8(c) illustrates fiber extension of the three last attached fibers, and wherein FIG. 8(d) illustrates the fibers after contact is lost.

FIG. 15 illustrates schematics of the force analysis in two different backing layer thickness cases under constant displacement: (a) fibers on an infinitesimal thick backing layer; (b) fibers on a very thick backing layer.

DETAILED DESCRIPTION OF THE INVENTION

Figure 3:
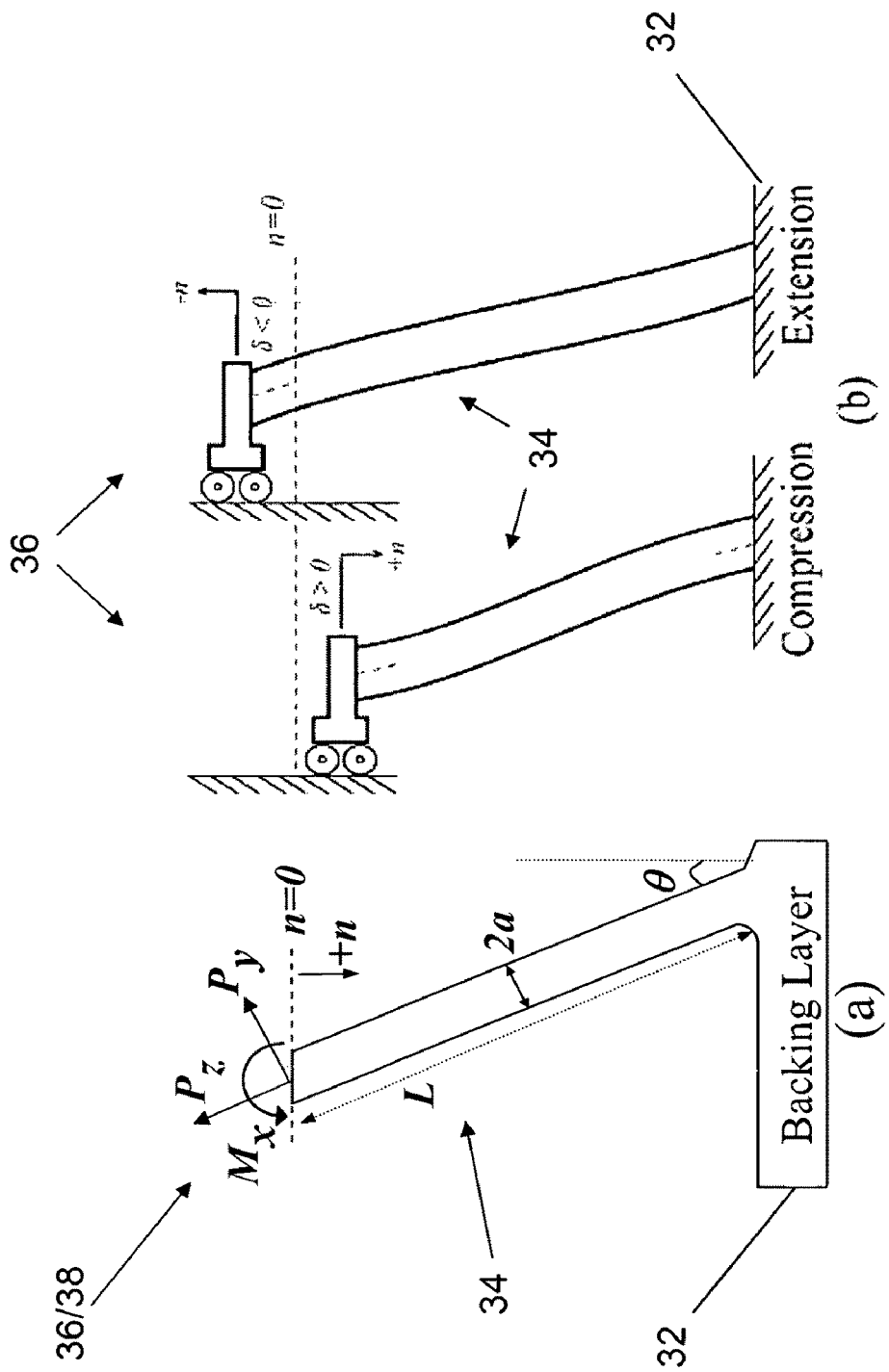
FIG. 3(a) illustrates the forces on the tip of a single fiber and FIG. 3(b) illustrates the fixed-guided boundary conditions of a fiber in contact with a locally flat surface during compression and extension. The angle of the fiber at both ends remains fixed while the tip moves only in the n direction.

The present invention is directed to dry adhesives and methods for making dry adhesives. The term "dry adhesive", as used herein, refers generally to individual dry adhesive fibers and also to materials including a plurality of dry adhesive fibers connected together. The combination of a plurality of fibers connected together, such as with a backing layer, will sometimes also be referred to herein as a fiber array. The present invention will also be described in terms of micro- and nanofibers, although the present invention is applicable to a wide variety of sizes and is not necessarily limited to a particular size range. In addition, particular embodiments of the present invention will often describe as using "photoresist". However, photoresist may be substituted for any energy sensitive material, and energy sensitive material means any material that selectively changes its characteristics when exposed to energy in order to accomplish the methods described in the present invention. The energy may be visible light, ultraviolet light, x-rays, and other forms of energy. The energy sensitive material used herein may be either positive or negative, such as positive or negative photoresist, depending on the particular application.

The present invention provides a method for fabrication of polymer microfiber arrays a through a micro-molding process which duplicates lithographically formed master template structures with a desired fiber material. This technique enables fabrication of fiber array patches inexpensively and with high yields. This is a significant advantage with compared to other proposed fibrillar adhesive fabrication techniques [A. K. Geim, S. V. Dubonos, I. V. Grigorieva, K. S. Novoselov, A. A. Zhukov, and S. Y. Shapoval. Microfabricated adhesive mimicking gecko foot-hair. *Nature Materials*, 2:461-463, 1 Jun. 2003.], [M. T. Northen and K. L. Turner. A batch fabricated biomimetic dry adhesive. *Nanotechnology*, 16:1159-1166, 2005.], [Y. Zhao, T. Tong, L. Delzeit, A. Kashani, M. Meyyappan, and A. Majumdar. Interfacial energy and strength of multiwalled-carbon-nanotube-based dry adhesive. *Journal of Vacuum Science 4 Technology B: Microelectronics and Nanometer Structures*, 24:331-335, 2006.]. Also, this method allows for design and fabrication of fibers with non-vertical orientation.

FIGS. 1a-1f illustrate one embodiment of the method according to the present invention. FIG. 1a illustrates a substrate 10 which is provided as the starting point for the method. The substrate 10 may be, for example, glass. Glass offer several advantages, such as reducing UV reflections during angled lithography. However, the substrate 10 may also be materials other than glass.

A template backing layer 12 is formed on the substrate 10. The backing layer 12 may be formed from photoresist, such as SU-8, or from other forms of photoresist, other forms of photosensitive polymers, or from other materials that have properties that can be selectively changed by exposing the material to light or by exposing the material to other energy sources. The backing layer 12 may be further processed so as to provide the desired characteristics. For example, it has been found that the template backing layer 12 may be baked and uniformly exposed to UV energy so as to provide improved adherence between the substrate 10 and a subsequently applied template layer 14.

It has been discovered that it is often advantageous to use the same photoresist material on both the backing layer 12 and the template layer 14. In particular, the bonding between the backing layer 12 and the structure formed from the template layer 14 is often better than in situations when different photoresist materials are used for those two layers 12, 14. However, any other liquid or solid coating material that could have a strong bonding with the fiber photoresist polymer could be also used as the backing material 12.

The following is one embodiment of the method of forming the backing layer 12 of SU-8 photoresist:

baking the backing layer 12 on hotplate at 65 C. for one minute;

ramping the temperature of the backing layer to 95 C.;

baking the backing layer at 95 C. for two minutes;

allowing the backing layer to cool slowly;

exposing the backing layer 12 to UV light for four minutes;

baking the backing layer at 65 C. for one minute (this step is sometimes referred to as "post exposure baking" ("PEB"));

ramping the temperature of the backing layer 12 to 95 C. and maintain that temperature for one minute; and slowly cooling the backing layer 12.

Many variations of this method are possible, and this description is illustratative of the present invention, and not limiting. For example, the temperatures and time periods may be changes, and steps may be added, removed, and their order changed.

The template layer 14 is formed on the template backing layer 12. The template layer 14 may be formed, for example, from SU-8 photoresist or from other materials as described above. The template layer 14 is exposed to a predetermined pattern of energy as is known in semiconductor and other lithography technologies. The energy may be applied vertically or orthogonally to the surface of the substrate 10, as in the illustrated embodiment, or it may be applied at an angle, or obliquely to the surface of the substrate 10. In some embodiments a patterned layer 16 may be formed on top of the template layer 14 as part of the process of exposing the template layer 14 to a predetermined pattern of energy. The patterned layer 16 may be formed with, for example, photoresist or the patterned layer 16 may be a contact mask. After the template layer 14 is exposed to the predetermined pattern of energy, the patterned layer 16 may be removed.

Thereafter, a portion of the template layer 14 is removed. The portion of template material 14 that is removed is related to the predetermined pattern of energy applied to the template layer 14. The energy may be, for example, ultraviolet light x-rays, or other forms of energy as is known in semiconductor fabrication and lithography. Depending on whether the photoresist of the template layer 14 is positive or negative, the removed material may have a direct or an inverse relationship to the pattern of energy provided to the template layer 14.

FIG. 1b illustrates a template structure 20 which remains after material is removed form the template layer 14. The template structure 20 is formed from the remaining photoresist from the template layer 14 and is connected to the substrate 10 via the template backing layer 12. In this embodiment, the template structure 20 may serve as the final product of this method. In that case, the template structure 20 is the dry adhesive structure 30 (described below beginning with FIG. 1e), and the template layer 14 is the dry adhesive material 28 (described below beginning with FIG. 1e). However, the template structure 20 is not suitable for some applications (for example, some materials used to make the template structure 20 are too brittle for some applications), and in those cases the template structure 20 may be used as a template to make a mold, which in turn can be used to make the desired dry adhesive structure. In that case, the template structure 20 corresponds to the structure that is desired, although the template structure 20 is not the final product. In this embodiment, the final structure will be made from a material different from that of the template structure 20.

FIG. 1c illustrate a mold material 22 that has been provided in the template structure 20. The mold material 22 is different from the material of the template structure 20, and it may be, for example, silicone rubber or other materials. The mold material 22 may be, for example, poured into the template structure 20 or otherwise deposited or provided into the template structure 20.

The mold material 22 is allowed to form a mold structure which is complimentary to the template structure 20. This may happen, for example, by allowing the mold material 22 to cure or to otherwise allow it to take the desired form. In the illustrated embodiment, the mold material is allowed to overflow the template structure 20, forming a mold backing layer 24 which connects the various parts of the mold material 22. The mold backing layer 24 may be desired, for example, as a base or platform on which to support the structure formed by the mold material 22. However, the mold backing layer 24 is not required with the present invention, and the present invention may be practiced without the mold backing layer 24.

After the mold material 22 has taken the desired form, the mold material 22 is separated from the template structure 20.

FIG. 1d illustrates the mold structure 26 which results after the mold material 22 has been separated from the template structure 20. The mold structure 26 has been rotated 180 degrees in the illustrated embodiment to facilitate the remainder of the method, as will be described hereinbelow. As can be seen in this figure, the mold backing layer 24 serves as a base for the mold structure 26.

FIG. 1e illustrates the mold structure 26 filled with a material 28 that will become the dry adhesive or fiber array fabricated by this process. The dry adhesive material 28 is allowed to form a dry adhesive structure 30 including one or more fibers 34. The fibers 34 include a tip having a flat surface 36 at the tip 38. The dry adhesive structure 30 is complimentary to the mold structure 26. The dry adhesive material 28 may be, for example, polymers, metals, or any other desired material. The dry adhesive material 28 forms the dry adhesive structure 30 by, for example, being allowed to cure or otherwise taking a desired form.

The dry adhesive structure 30 may overfill the mold structure 26, so as to form a dry adhesive backing layer 32 which connects the dry adhesive material 28 within the recesses of the mold structure 26. In the illustrated embodiment, the backing layer 32 is outside of the mold structure 26 and on top of the mold structure 26. In other embodiments, the mold structure 26 may include a recess at the top in which the backing layer 32 may be formed so that the backing layer 32 is within the mold structure 26. The thickness of the backing layer 32 may be varied and controlled, so as to form a desired thickness. The thickness of the backing layer 32 can have a significant affect on the performance of the dry adhesive structure 30, and this is discussed in more detail hereinbelow. After the dry adhesive material 28 is allowed to form a dry adhesive structure 30, it is removed from the mold structure 26.

FIG. 1f illustrates dry adhesive structure 30 after it is separated from the mold structure 26 and rotated 180 degrees, leaving the dry adhesive structure 30 in the desired form. The dry adhesive structure 30 has the same shape as the template structure 20 illustrated in FIG. 1b. Furthermore, the mold structure 26 may be used more than one time in order to form more than one dry adhesive structure 30. As a result, the method steps illustrated and described with respect to FIGS. 1a-1d may be performed one time, and the method steps illustrated and described with respect to FIGS. 1e and 1f may be performed many times.

FIGS. 2a and 2b illustrate another embodiment of the method according to the present invention in which the template structure 20 is the dry adhesive structure 30. In that embodiment, the dry adhesive structure 30 is formed directly and without the use of the mold structure 26. FIG. 2a illustrates a substrate 10 which is provided as the starting point for the method. The substrate 10 may be the same as that described above with respect to FIG. 1a.

A dry adhesive backing layer 40 is formed on the substrate 10. The dry adhesive backing layer 40 may be formed in same manner and from the same materials as the template backing layer 12. However, rather than provide improved adherence between the substrate 10 and a material that will become a template for a mold, the backing layer 40 provides improved adherence between the substrate 10 and a material 42 that will become the dry adhesive structure 30. The backing layer itself 12/40, however, may be the same in either application.

The dry adhesive layer 42 is an energy sensitive material, and the dry adhesive layer 42 is formed on the dry adhesive backing layer 40. However, unlike the dry adhesive material 28 used with respect to FIGS. 1e and 1f, a mold 26 is not used this embodiment. Instead, the dry adhesive layer 42 is formed from an energy sensitive material, such as photoresist or the other materials discussed above with regard to the template layer 14.

The dry adhesive layer 42 is exposed to a predetermined pattern of energy as described above. The energy may be applied vertically so as to form vertical features, as in the illustrated embodiment, or it may be applied at an angle so as to form angle features. In some embodiments a patterned layer 16 may be formed on top of the dry adhesive layer 42 as part of the process of exposing the dry adhesive layer 42 to a predetermined pattern of energy. The patterned layer 16 may be formed with, for example, photoresist. After the dry adhesive layer 42 is exposed to the predetermined pattern of energy, the patterned layer 16 may be removed.

Thereafter, a portion of the dry adhesive layer 42 is removed. The portion of dry adhesive layer 42 that is removed is related to the predetermined pattern of energy applied to the dry adhesive layer 42. Depending on whether the photoresist or other energy sensitive material of the dry adhesive layer 42 is positive or negative, the removed material may have a direct or an inverse relationship to the pattern of energy provided to the dry adhesive layer 42.

FIG. 2b illustrates dry adhesive structure 30 which remains after material is removed form the dry adhesive layer 42. The dry adhesive structure 20 is formed from the remaining photoresist from the dry adhesive layer 42 and is connected to the substrate 10 via the dry adhesive backing layer 40.

FIG. 3(a) illustrates the forces on the tip of a single fiber. FIG. 3(b) illustrates the fixed-guided boundary conditions of a fiber in contact with a locally flat surface during compression and extension. The angle of the fiber at both ends remains fixed while the tip moves only in the n direction. These boundary conditions are critical to model the correct single fiber adhesion on a locally flat surface.

Figure 4:
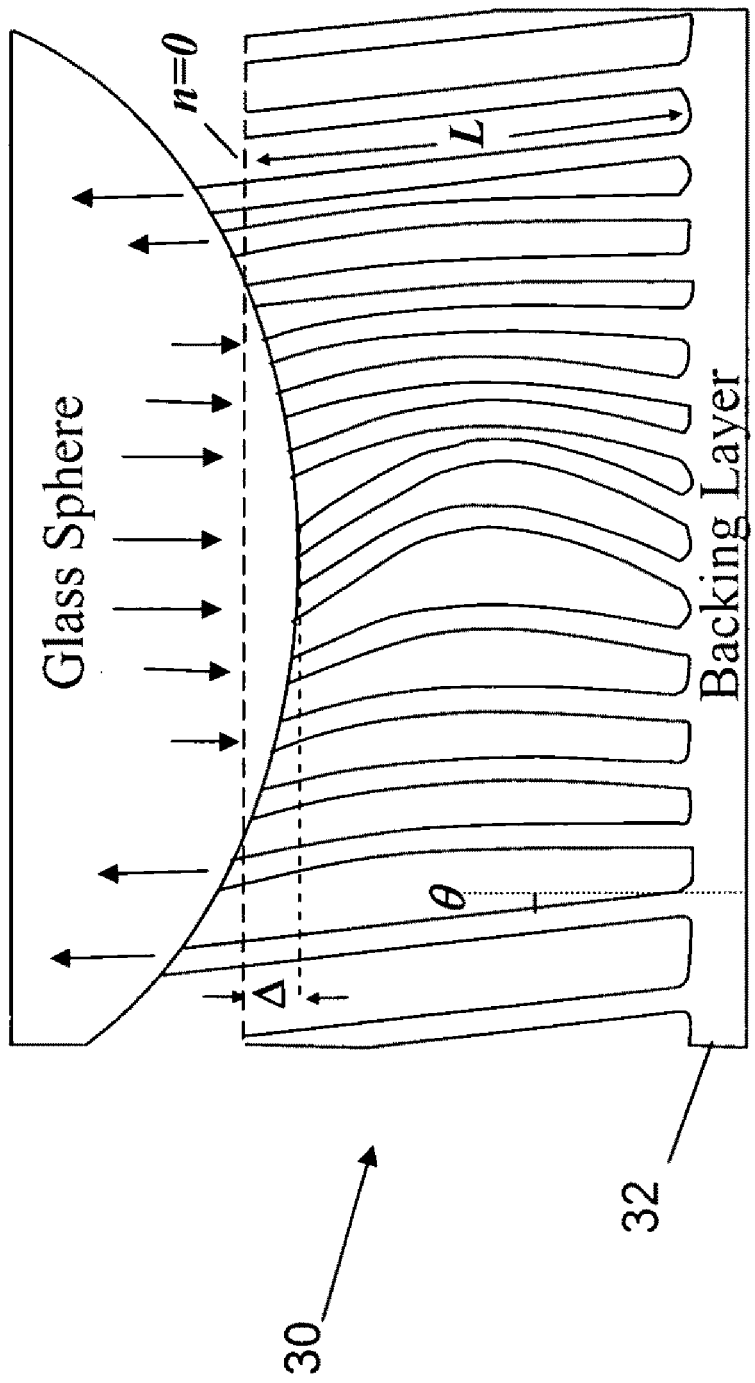
FIG. 4 illustrates a sphere retracting from an array of fibers (not to scale). The fibers close to the middle of the sphere are compressed, and the ones that are in contact on the edges are stretched. The arrows in the diagram represent the direction and relative magnitude of the forces on the fibers.

FIG. 4 illustrates a sphere retracting from an array of fibers (not to scale). The fibers close to the middle of the sphere are compressed, and the ones that are in contact on the edges are stretched. The arrows in the diagram represent the direction and relative magnitude of the forces on the fibers. Modeling the contact of any fiber array 30 with a spherical asperity is important to understand the fiber array's 30 macroscale adhesion on a single spherical asperity, which gives an analogy of adapting to a surface roughness with these fibers.

Master Template Fabrication

The present invention will now be described in terms of specific examples. These examples are illustrative of the present invention are not limiting. In these examples, micron scale fibers are selected because they allow consistent fabrication results and they are large enough to be easily visible with optical microscopy. However, the fiber fabrication techniques of this invention can be directly applied and extended to few micron or nanoscale fibers.

The template structure 20 (also referred to as the "master template") for the molding process will be described in terms of using SU-8 photoresist, although in other embodiments the template structure 20 may also use other materials as described herein.

Figure 5:
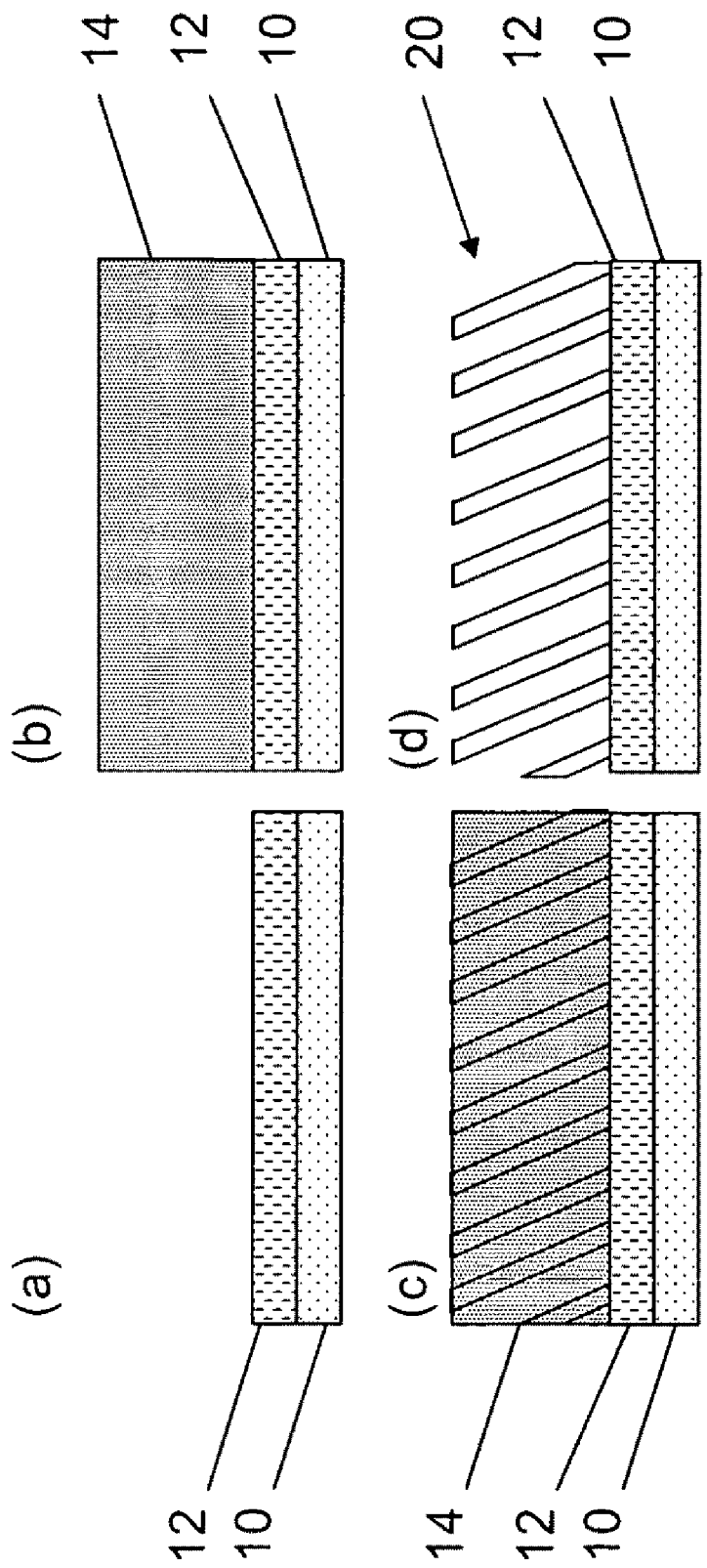
FIGS. 5(a)-5(d) illustrate process steps of the polymer microfiber fabrication according to another embodiment of the present invention.

FIGS. 5(a)-5(d) illustrate an embodiment of the method according to the present invention that uses SU-8 photoresist (SU-8 2025, MicroChem) 12 on a glass wafer substrate 10. The glass wafer substrate 10 is used to prevent UV reflections during angled lithography. First, a thin layer of diluted SU-8 photoresist 12 is spun onto a substrate wafer 10 to provide a thin polymer backing 12 for the microfibers that will be formed. The layer 12 is baked and uniformly exposed with UV light (FIG. 5(a)). This backing layer 12 was found to be important for the process since the adherence between SU-8 and the substrate 10 is too weak to keep the high aspect ratio microfibers anchored firmly otherwise. Next, another layer of SU-8 14 is spun atop the first layer 12 as seen in FIG. 5(b). The thickness of this layer 14 determines the height of the microfibers, usually between 30 μm and 100 μm. A contact mask (not shown) with 2 to 20 μm diameter circular clear areas in square packing arrangement is used to pattern the template layer 14 with directional UV light (FIG. 5(c)). The wafer is then developed in a liquid bath (SU-8 developer, MicroChem) for up to 20 minutes to remove the unexposed photoresist from the template layer 14, leaving the pattern of exposed photoresist pillars forming the template structure 20 (FIG. 5(d)).

FIGS. 6(a) and 6(b) illustrate scanning electron microscope images of fiber arrays 30 formed using the present invention. In this embodiment of the invention, the exposure of the UV light is perpendicular to the surface of the substrate 10 to form vertically oriented fibers. Results from this lithographic technique can be seen in FIG. 6(a). Large fiber arrays 30 on the order of 300 mm$^2$ of long hair-like independent fibers are produced. Fibers with diameters from 4 μm to 25 μm diameter are produced with aspect ratios of up to 20:1. 10:1 aspect ratio fiber arrays 30 exhibit excellent uniformity and tend to remain upright.

UV diffraction and the SU-8 properties limit the resolution to approximately 2 μm for high aspect ratio structures, and consistent fabrication of features of this size is challenging. More advanced exposure techniques may be employed to reach higher aspect ratios or smaller diameters. For example, Bogdanov et al. have demonstrated using x-ray lithography that it is possible to form vertical independent SU-8 fibers with aspect ratios in excess of 50:1 [A. L. Bogdanov and S. S. Peredkov. Use of su-8 pr for very high aspect ratio x-ray lithography. *Microelectronic Engineering*, 53:493-496, 2000.]. X-ray lithography also allows for sub-micron diameter features [R.-Y. Shew, J.-T. Hung, T.-Y. Huang, K.-P. Liu, and C.-P. Chou. High resolution x-ray micromachining using su-8 resist. *Journal of Micromechanics and Microengineering*, 13:708-713, 2003.] which can be used for nanofiber fabrication.

To avoid fiber clumping, the geometry parameters for the fibers are selected by considering energy balance equation given by [K. L. Johnson, K. Kendall, and A. D. Roberts. Surface energy and contact of elastic solids. *Proceedings of the Royal Society of London*. Series A, 324:301-313, 1971.]. The lithography mask 16 determines the radius and spacing between fibers, leaving only fiber length and angle as variables. Fiber length is determined by the thickness of the SU-8 layer 14 and can be varied by changing the SU-8 viscosity or spin speed.

FIG. 6(b) illustrates the dependence of fiber collapse on fiber length. Collapse occurs during the drying phase after development and rinsing when water droplets repel the hydrophobic fibers pressing them into contact with each other. The dependence of collapse on fiber length can be seen in FIG. 6(b) where the only variation across the image is increasing fiber length from left to right. The shorter fibers on the left side are standing independently alongside the longer fibers which have collapsed laterally. Collapse generally occurs between more than a pair of fibers, so in addition to the distance between adjacent fibers, the arrangement pattern of the fibers determine clumping conditions. Square packing of fibers has been determined to allow close packing without clumping [C. Majidi, R. Groff, and R. Fearing. Clumping and packing of hair arrays manufactured by nanocasting. *Proc. of the ASME International Mechanical Engineering Congress and Exposition*, pages 1-6, 2004.].

FIG. 7(a) illustrates angled microfibers that were fabricated using the same lithographic technique as described above. By varying the UV exposure angle by tilting the wafer during exposure, the fibers are formed at a non-perpendicular angle to the substrate 10 surface. Using Snell's law, the UV exposure angle can be calculated for the desired fiber angle [K.-Y. Hung, H.-T. Hu, and F.-G. Tseng. Application of 3d glycerol-compensated inclined-exposure technology to an integrated optical pick-up head. *Journal of Micromechanics and Microengineering*, 14:975-983, 2004.]. From our tests, tilting the wafer with around 45° slope reliably formed fibers with angles of around 25° from vertical. Hung et al. showed that angled structures of up to 60° from vertical are achievable by immersing the wafer in glycerol during exposure to decrease refraction [K.-Y. Hung, H.-T. Hu, and F.-G. Tseng. Application of 3d glycerol-compensated inclined-exposure technology to an integrated optical pick-up head. *Journal of Micromechanics and Microengineering*, 14:975-983, 2004.]. One advantage of this method for fabricating angled fibers is that the tip shape is flat and roughly parallel to the substrate 10 rather than perpendicular to the fiber axis. This increases the contact area of the tips when in contact with a surface.

Micromolding

Since the SU-8 material properties are not ideal for use as a structural material due to its brittleness and weak bond with the backing substrate, it is desirable to create a mold in which to replicate the fibers with a different polymer material. Moreover, molding enables the selection of wide range of polymer materials as the fiber material, and the master template can be used tens or hundreds of times which increases the fabrication speed and reduces the cost significantly. A compliant mold is fabricated by pouring a liquid silicone rubber (HS-II, Dow Corning) over the wafer and allowing it to cure at room temperature for 24 hours. Once cured, the mold is carefully peeled away from the template wafer resulting in a flexible mold with the negative shape of the SU-8 fibers. This mold is used to vacuum mold liquid polyurethanes or other curable materials (except silicone rubbers which bond to the template rubber material) with the desired physical properties. Once cured and de-molded, the polyurethane fibers have roughly the same geometry as the original SU-8 fibers.

Figure 7:
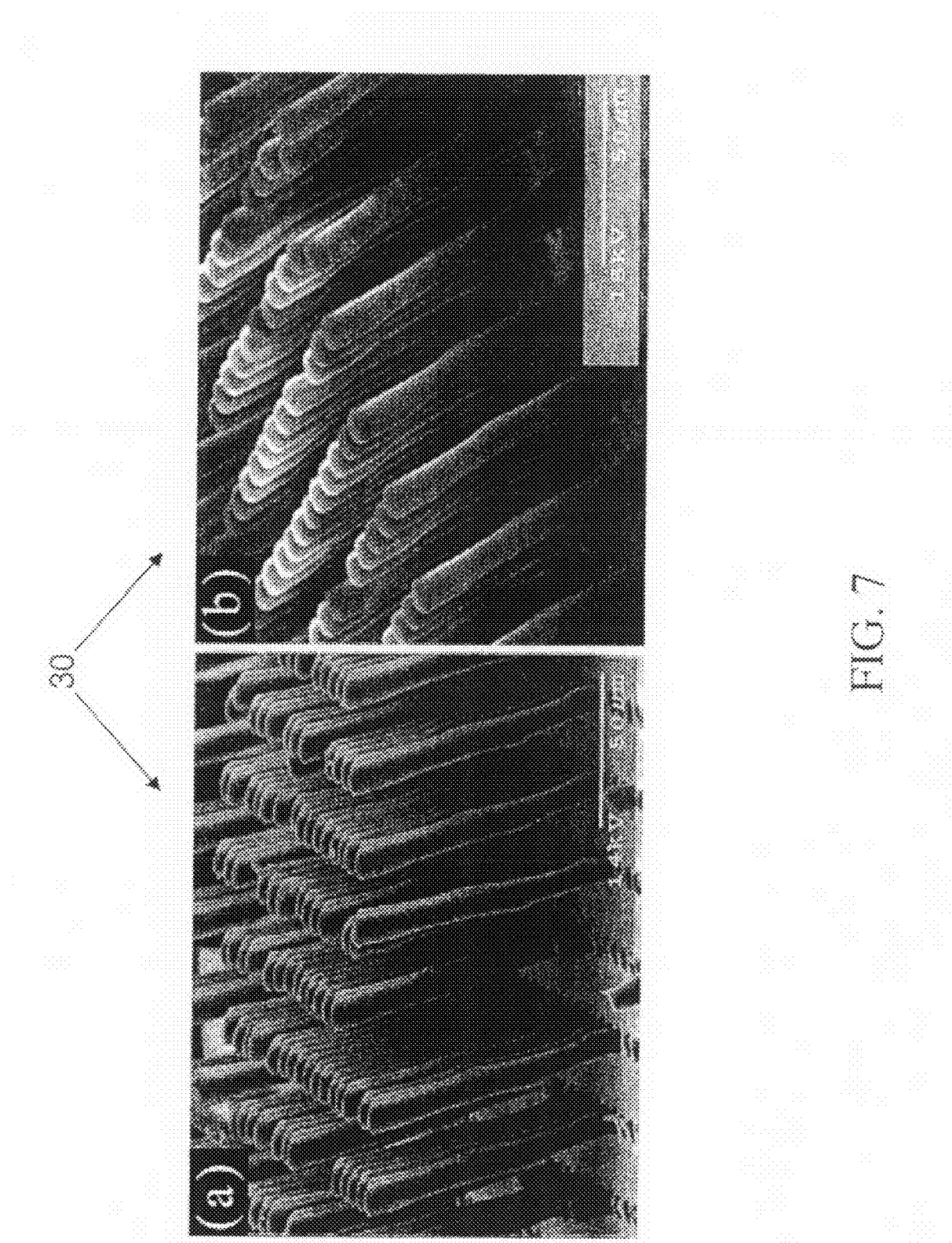
FIG. 7(a) is an SEM micrograph of 8 µm diameter SU-8 high aspect ratio angled fiber array master template.
FIG. 7(b) illustrates polyurethane molded microfibers with the same geometry.

Using this method, the microfiber material may be altered to suit the intended design. However, the same lateral collapse laws apply, so the design must stay within the lateral collapse requirements for both SU-8 (to create the template) and the secondary fiber material to ensure that self-supporting independent fibers are formed. This technique has been successfully implemented to create angled high aspect ratio polyurethane fibers from SU-8 templates 20, as shown in FIG. 7. However, the successful de-molding of the high aspect ratio SU-8 fiber arrays 30 without fracturing many of the fibers is a significant challenge.

Macroscale Adhesion Experiments

Fiber array 30 test samples were fabricated using the methods described above with polyurethane elastomers (ST-1087 and ST-1060; BJB Enterprises) which have high tensile strength (6 MPa) and are available commercially with wide range of elastic moduli. The hardness of these polymers are Shore 83 A and 60 A, respectively and were determined through tensile testing to have Young's modulus of approximately 9.8 MPa and 2.9 MPa, respectively. Fiber arrays 30 with varied lengths and angles were fabricated for testing as described in Table 1.

TABLE 1

| Sample Type | Height | Diameter (2a) | Length (L) | Angle ($\theta$) | Fiber Spacing (d) |
|---|---|---|---|---|---|
| Short Vertical | 48 μm | 20 μm | 48 μm | 0° | 40 μm |
| Long Vertical | 100 μm | 25 μm | 100 μm | 0° | 40 μm |
| Long Angled | 75 μm | 25 μm | 79 μm | 18° | 40 μm |

These geometries were selected because they allow consistent fabrication results and are large enough to be easily visible with optical microscopy. The backing layer 12 is approximately 2.5 mm thick for all samples.

First, an atomic force microscope (AFM) (Veeco CP-II) is used to characterize the polyurethane-glass interfacial effective work of adhesion $W_f$ which is used to calculate the adherence of a single fiber in $P_f = \sqrt{6\pi a^3 K w_f}$. In contrast to the data from macroscale measurements of a flat polyurethane sample, the AFM data exhibit reduced bulk viscoelastic effects and more closely approximate the single fiber adhesion. In the absence of bulk viscoelastic effects, the surface viscoelastic losses and the thermodynamic work of adhesion can be combined into a single term $w_f$ which is used in elastic theory equations [K. R. Shull. Contact mechanics and the adhesion of soft solids. *Materials Science and Engineering R*, 36:1-45, 2002.] to predict the adhesion of a single fiber. A 12 μm diameter silica particle attached AFM probe (Novascan) with 14 N/m bending stiffness is used to measure the pull-off force between the particle and a flat polyurethane surface using ten measurements. Using the Johnson-Kendall-Robert (JKR) adhesion model for a sphere-plane interaction, $w_f$ is computed from [K. L. Johnson, K. Kendall, and A. D. Roberts. Surface energy and contact of elastic solids. *Proceedings of the Royal Society of London*. Series A, 324:301-313, 1971.]

$$P_{cs} = \frac{3}{2}\pi R_p w_f \quad (1)$$

where $P_{cs}$ is the pull-off force and $R_p$, is the particle radius. Using the measured pull-off force and (1), the effective work of adhesion $w_f$ for glass and ST-1060 polyurethane interface was computed as 93 mJ/m$^2$.

In most of the previous works [A. K. Geim, S. V. Dubonos, I. V. Grigorieva, K. S. Novoselov, A. A. Zhukov, and S. Y. Shapoval. Microfabricated adhesive mimicking gecko foothair. *Nature Materials*, 2:461-463, 1 Jun. 2003.], [B. Yurdumakan, N. R. Raravikar, P. M. Ajayanb, and A. Dhinojwala. Synthetic gecko foot-hairs from multiwalled carbon nanotubes. *Chemical Communications*, page 3799-3801, 2005.], micro/nanoscale local adhesion of synthetic fibers was tested using an AFM. Although these local measurements can give detailed insight into the individual fiber adhesion micro/nanomechanics, the overall macroscale behavior of the fiber array can be significantly different. Moreover, AFM based or other [Y. Zhao, T. Tong, L. Delzeit, A. Kashani, M. Meyyappan, and A. Majumdar. Interfacial energy and strength of multiwalled-carbon-nanotube-based dry adhesive. *Journal of Vacuum Science 4 Technology B: Microelectronics and Nanometer Structures*, 24:331-335, 2006.], [M. T. Northen and K. L. Turner. A batch fabricated biomimetic dry adhesive. *Nanotechnology*, 16:1159-1166, 2005.] local measurements do not allow observation of the fiber tip contact during the adhesion measurements. Therefore, macroscale adhesion and overall work of adhesion of fabricated polymer microfiber arrays are characterized in this work using a custom tensile adhesion measurement setup with an optical imaging capability to observe the real-time contact area.

The custom macroscale adhesion measurement system consists of a top-view reflection type optical microscope (Nikon Eclipse L200) or an inverted optical microscope (Nikon Eclipse TE200) with an automated high precision stage (MFA-CC; Newport) which holds a high resolution load cell (GSO-25; Transducer Techniques Inc.). A 12 mm diameter glass hemisphere (QU-HS-12; ISP Optics) is connected to the load cell. The adhesive samples are placed on the microscope stage with the fiber arrays facing toward the glass hemisphere. Custom real-time software controls the stage to move the hemisphere into contact with the fiber sample at a fixed velocity until a pre-specified preload force is reached. The hemisphere is then retracted at a speed of 1 j·cm/s until it detaches from the sample. The software continually captures the force data from the load cell as well as timestamped video from the microscope.

Figure 8:
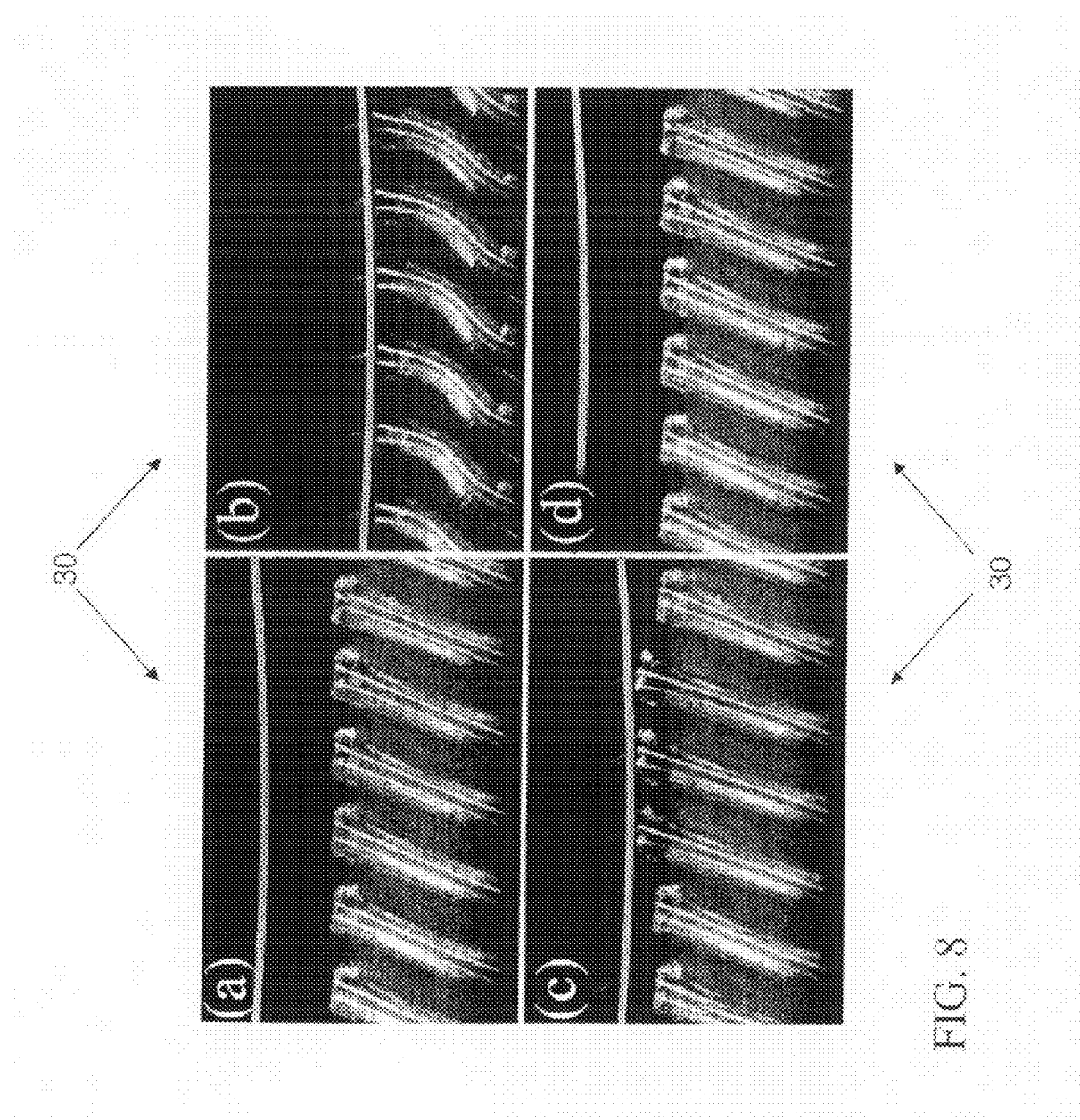

Two types of experiments are possible with this setup. The first mode, referred to as profile view mode, uses a cut cross section of the fiber array area which contacts only half of the hemisphere under the top-view microscope. This allows the camera to record images and video of the fiber deformation during contact and retraction. Using this setup mode it is possible to observe the compression, bending, buckling, and stretching behavior of the fibers 34 during the testing as seen in FIG. 8. In the other mode, inverted view mode, the hemisphere contacts the center of the array 30 of fibers. This mode provides more consistent adhesion data and allows viewing of the real contact area. Thus, profile view mode is used to examine the qualitative behavior of the surfaces during contact, whereas inverted view mode is used for quantitative analysis.

Figure 9:
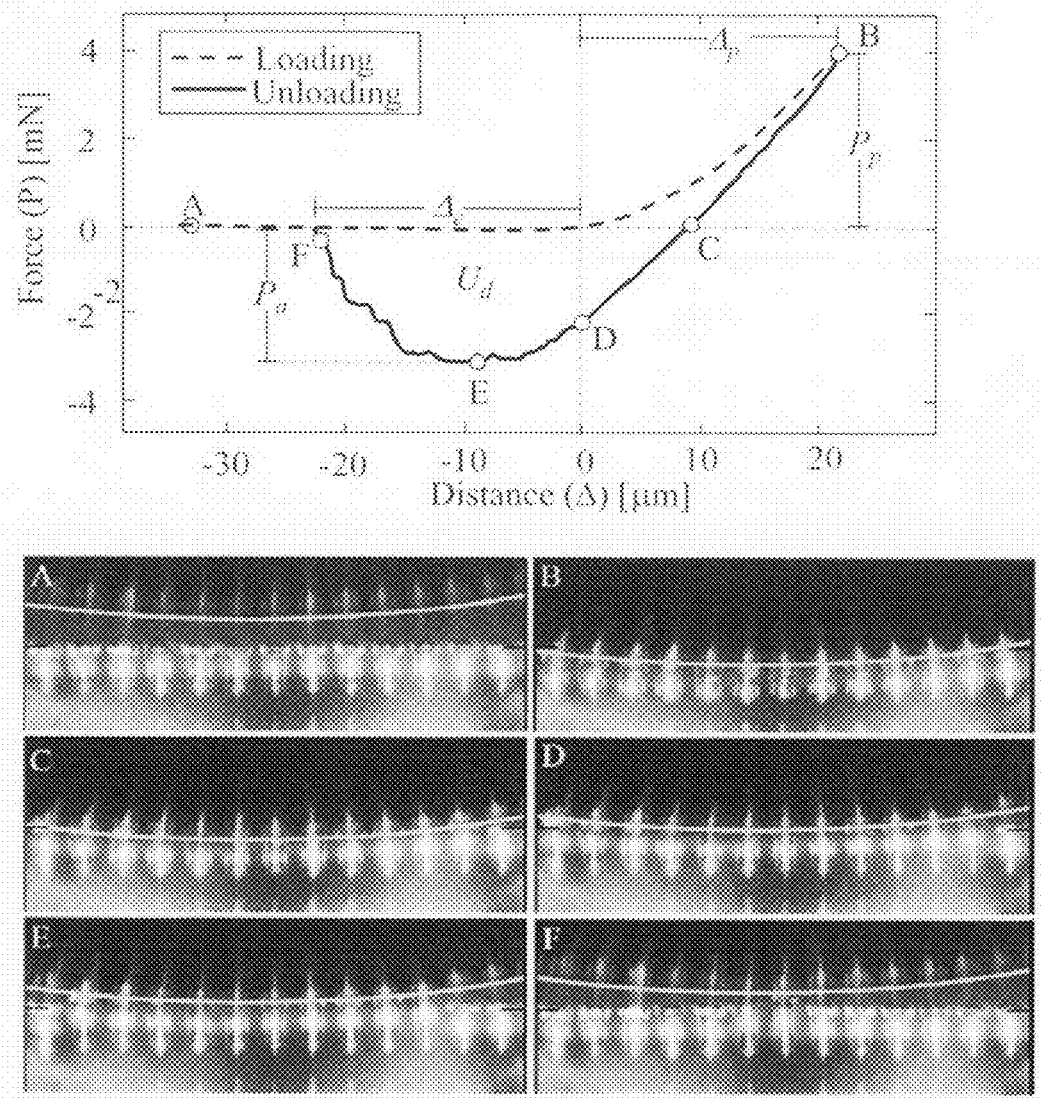
FIG. 9 illustrates sample force-distance experimental data during a typical profile view mode imaging of a manually cut cross-section of long vertical ST-1060 polyurethane fibers. The images from the timestamped video correspond to the labeled points in the force-distance curve and show the compression due to the preload force (point B) and extension during unloading (points C-F) with solid lines overlayed on the edge of the hemisphere and black marks on n=0 for clarity. Maximum separation force occurs at point E.

For computing the overall work of adhesion for the macroscale measurements on the fiber arrays 30, force-distance data from the hemisphere tests are used to calculate the energy dissipation $U_d$ by numerically integrating the area between the loading and unloading force curves. The known deflection of the load cell stem is used to correct the displacement data before the area integration is realized. Corrected force-distance data from a single measurement is shown in FIG. 9. In this case, an array 30 of long vertical polyurethane fibers was tested with a 1 mm diameter steel sphere. The sphere starts above the fiber array tips (A). The force during the approach is zero until the sphere makes initial contact with the fibers at n=0. The preload force ($P_p$) is the maximum positive force peak (B) when the sphere has penetrated the fiber array by distance $\Delta_p$. The force equilibrium point (C) occurs when the tension in the outer fibers is balanced by the compression of the inner fibers. Note from point (C) and the corresponding image indicate that this occurs before the sphere is completely retracted beyond the fiber tips. When $\Delta$=0 (D), all of the contacting fibers are in tension. As the sphere continues to retract, the fibers extend and the most highly extended fibers lose contact. The maximum separation force ($P_a$) is the value of the negative peak (E) where the sum of the forces of the contacting fibers is the greatest. After this point, the total force decreases because the loss in adhesion due to fibers detaching is greater than the force due to the increased extension of the attached fibers. Finally, the last fiber is stretched (F) to its maximum ($\delta_c = \Delta_e$) and then pulls off, returning the overall force to zero.

Experimental Results

Figure 6:
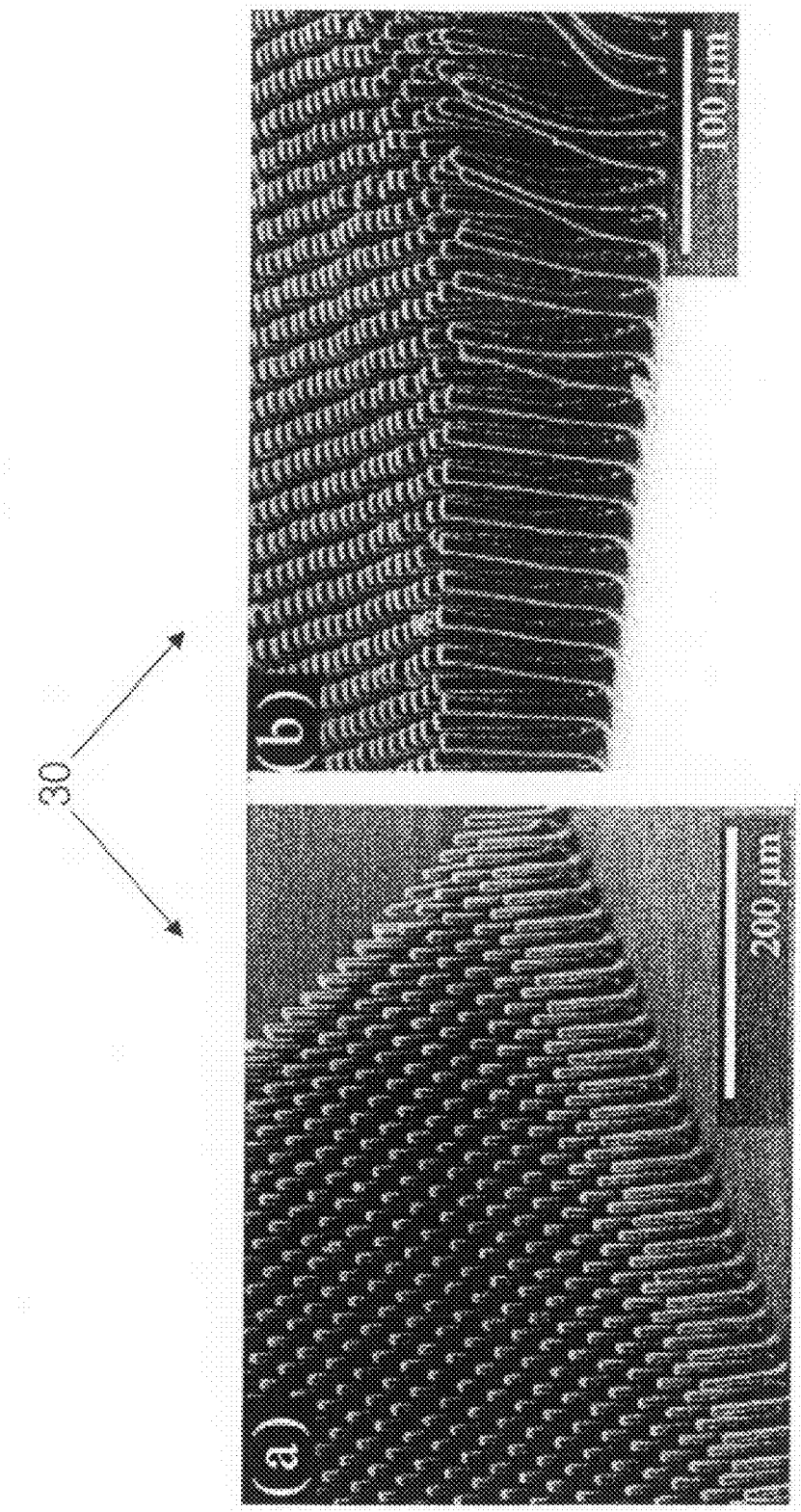
FIG. 6(a) is an SEM micrograph of 6 µm diameter SU-8 polymer high aspect ratio fiber array.
FIG. 6(b) illustrates that as fiber length increases (from left to right) past the maximum stable length the fibers collapse together.

The initial results from experiments in profile view mode indicated that the stiffer ST-1087 polyurethane fibers lose tip contact when compressed, greatly reducing the contact area and adhesion. This was particularly problematic for angled fibers, which showed almost no extension or adhesion. The more compliant ST-1060 polyurethane fibers did not exhibit this behavior and remained in full contact when compressed as seen in FIG. 8(*b*). FIG. 6(*b*) also suggests that the fixed-guided boundary conditions used in the modeling section are appropriate. This resulted in the increased extension (FIG. 8(*c*)) and adhesion of the softer fibers. Therefore, the remainder of experiments discussed in this paper were conducted on the more compliant ST-1060 polyurethane fibers.

A series of experiments were conducted in inverted view mode on a flat polyurethane control sample and the fiber arrays detailed in Table 1. The preload force was varied from 1 to 50 mN, and the approach and retraction speeds were 1 μm/s. Five measurements were taken for each sample at each of eight preselected preload values, and the contact point was moved to a different location on the fiber array for each measurement.

Figure 10:
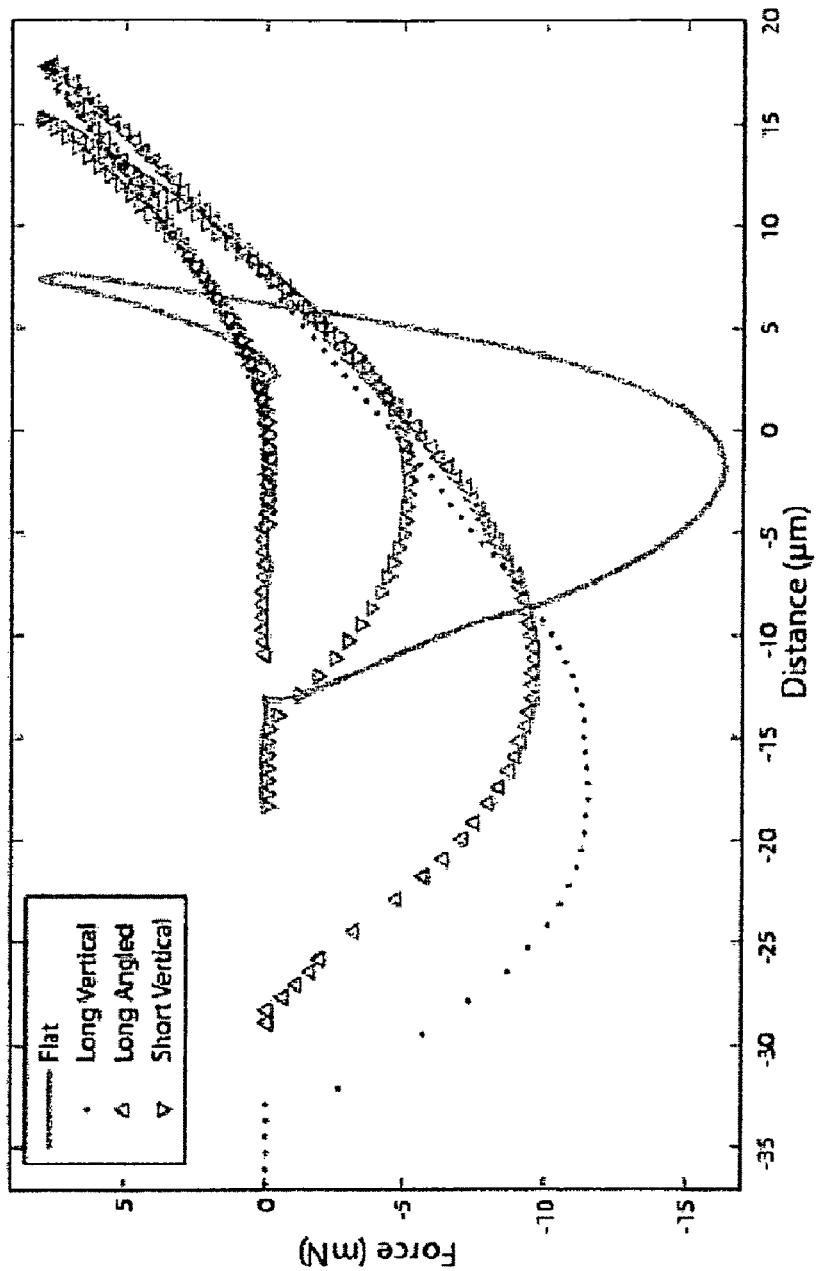
FIG. 10 illustrates force-distance plots for the tested flat, long and short vertical, and long angled fiber array samples given in Table 1. Each line is an average of data over three runs under identical conditions with eight mN preload.

Averaged force-distance data from the experiments at 8 mN preload for all of the sample types are plotted together in FIG. 10, which provides a visual comparison of the performance of the various samples. The flat sample shows the highest stiffness with least penetration depth ($\Delta_p$) followed by the short vertical fibers, long vertical, and long angled fibers, respectively. The maximum separation force ($P_a$) is higher for the flat material than for any of the fiber samples. The flat sample has the smallest maximum extension ($\Delta_c$), followed by the short vertical, long angled, and long vertical fiber samples, respectively.

Figure 11:
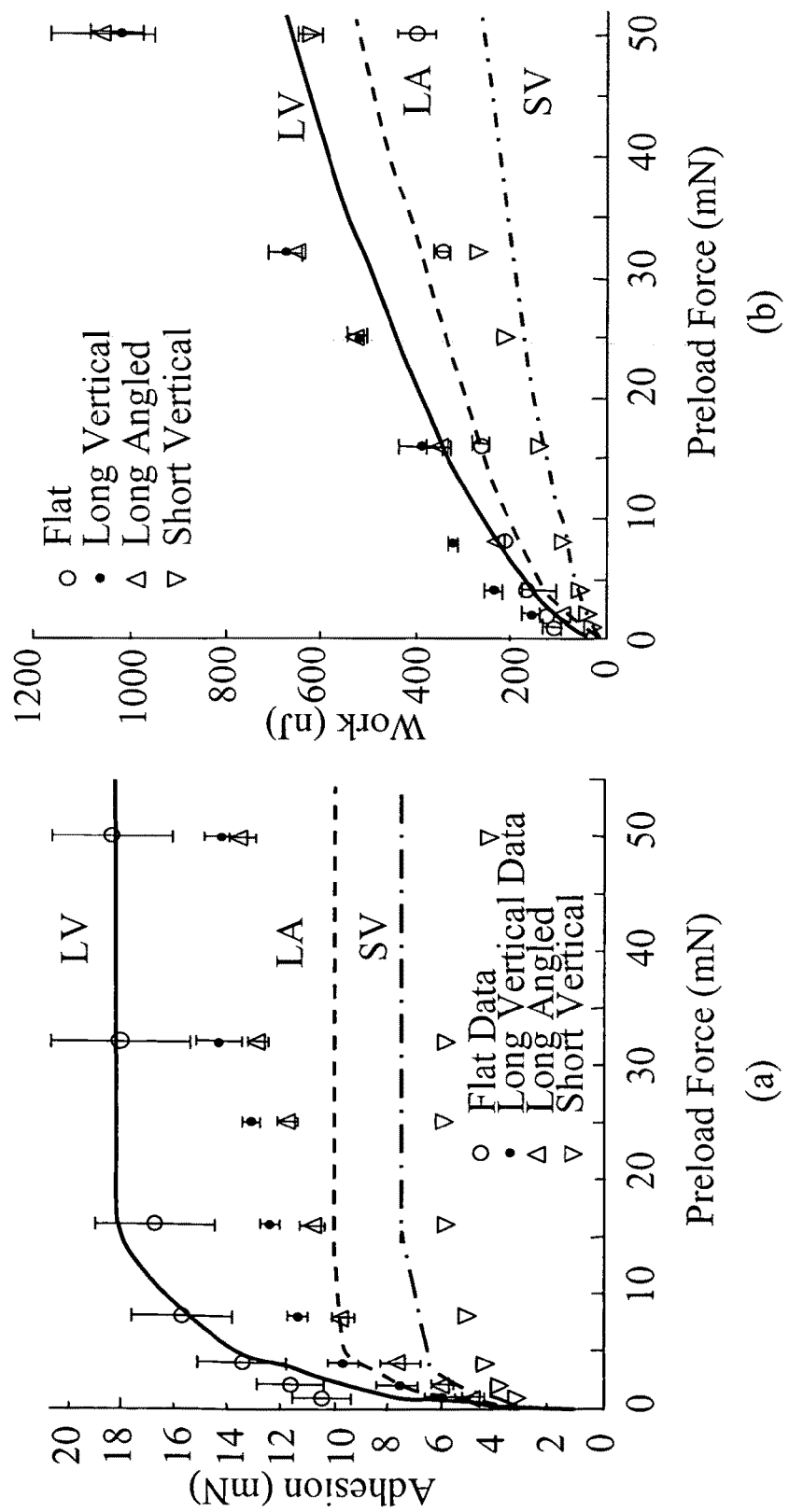
FIG. 11(a) illustrates maximum separation force as a function of preload for the tested samples.
FIG. 11(b) illustrates energy dissipation as a function of preload. The simulation results are lines (LV: long vertical, LA: long angled, SV: short vertical) and the experimental data are markers.

To examine the effect of preload on maximum separation force, a plot is generated from the maximum separation forces for each sample for the range of preload values (FIG. 11(*a*)). The data are plotted along with the simulation results for the same fiber and hemisphere geometry. A similar plot is generated to examine the effect of preload on dissipated energy (FIG. 11(*b*)). In the figure, the simulation results are the lines (LV: long vertical, LA: long angled, SV: short vertical) and the experimental data are the markers. All curves show an increase in adhesion with increased preload.

Although the preload values were controlled for each experiment, the contact areas are not consistent across the various samples because of their varying softness. In order to determine adhesion strength and overall work of adhesion trends, it is necessary to divide the total force or dissipated energy by the maximum contact area.

Figure 12:
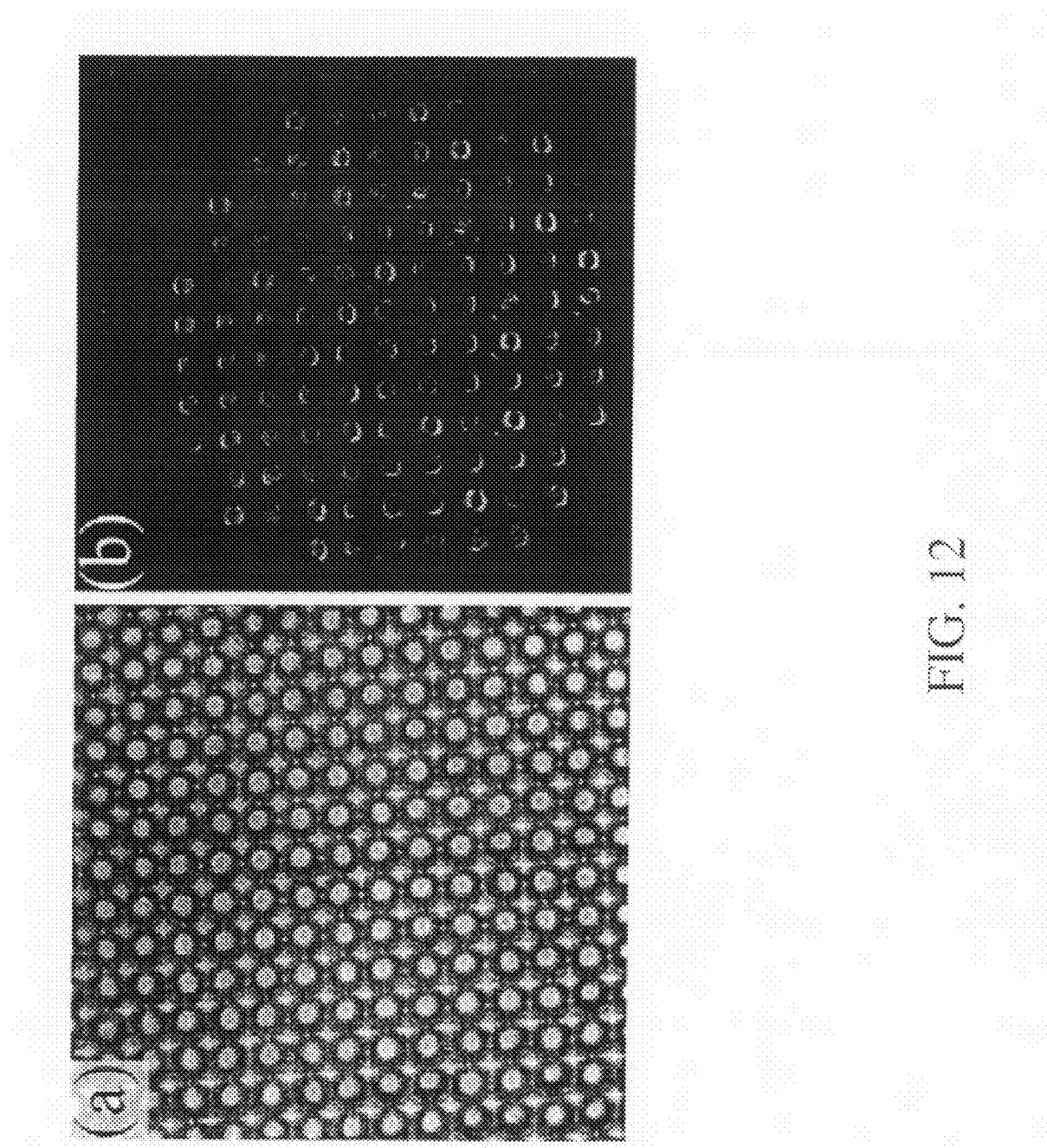
FIG. 12(a) illustrates inverted microscope image frames during testing 25 µm diameter long vertical fibers from below.
FIG. 12(b) illustrates real maximum contact area created from the same frame by image subtraction methods.
Figure 13:
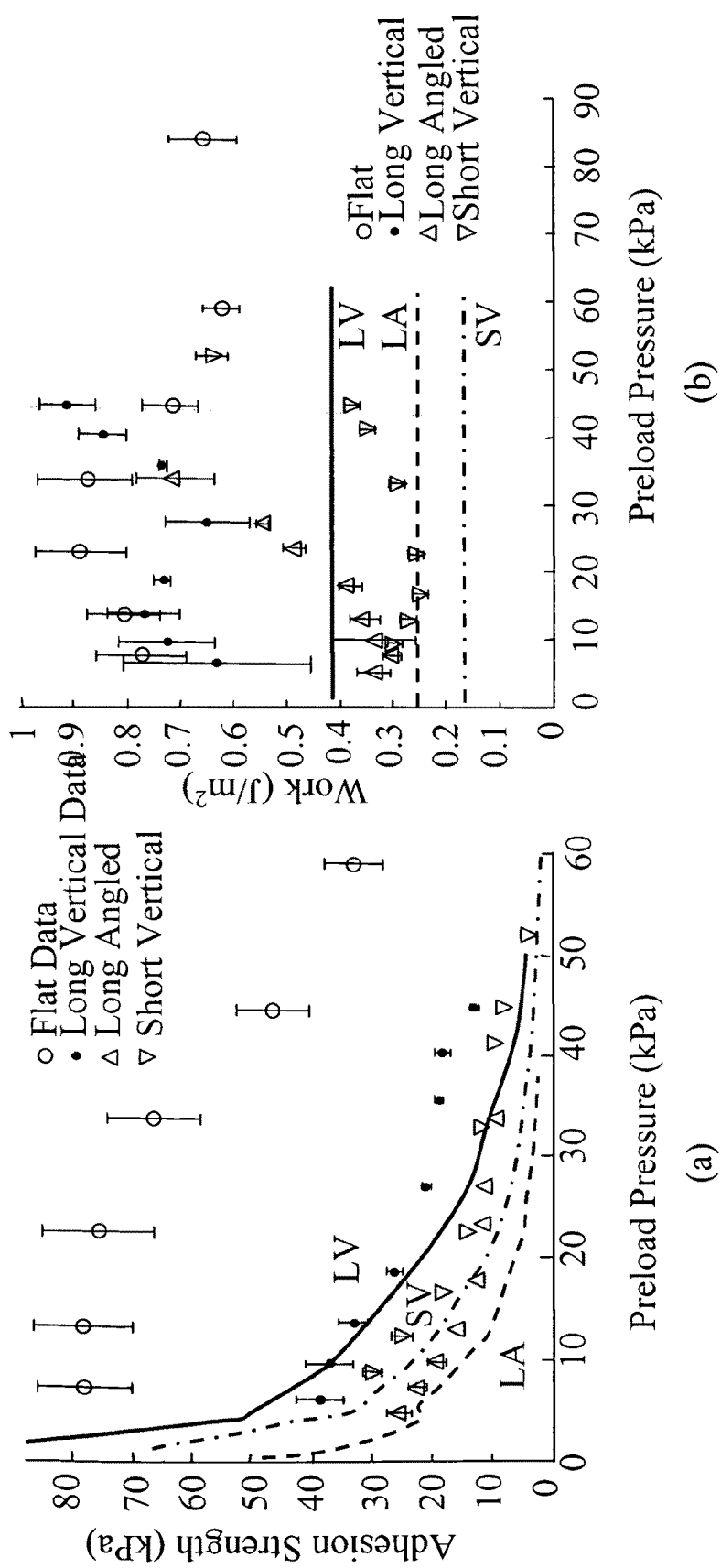
FIG. 13(a) illustrates adhesion strength and FIG. 13(b) illustrates overall work of adhesion as a function of preload pressure. The simulation results are lines (LV: long vertical, LA: long angled, SV: short vertical) and the experimental data are markers.

The relationship between preload force and real maximum contact area ($A_{max}$) was found using image processing methods. Contact areas were calculated for the same eight preload values for each sample using image subtraction methods on the corresponding video. To see $A_{max}$ in a given frame, a reference frame with no contact is subtracted leaving only the difference between the two images which are the contacted fibers (FIG. 12). The contact area is taken as the area of the smallest circle which contains all of the contacting fibers. These $A_{max}$ values are used to calculate the adhesion strengths and overall work of adhesion ($W_t$). For the simulation data, the simulated maximum contact area is used. Preload pressure, adhesion strength, and work of adhesion are calculated by dividing the preload, maximum separation force, and energy dissipation (($U_d$) by $A_{max}$, respectively. The adhesion strength ($p_a$) and overall work of adhesion ($W_t$) values are plotted with respect to preload pressure in FIG. 13.

The feasibility of fabricating high density and high aspect ratio microfiber arrays in large areas has been confirmed. The use of UV photolithography as a fabrication process for high aspect ratio self-supporting microfibers has been demonstrated, including fabrication of angled fiber arrays. Micromolding high aspect ratio angled polymer microfiber arrays by means of a compliant intermediate mold was demonstrated. Fabricated microfiber array samples were tested using a custom adhesion measurement system.

The Effect of the Backing Layer Thickness.

It has also been found that the thickness of the backing layer 32 has a greater effect on the performance of dry adhesives than was previously known. The effect of the backing layer 32 thickness on adhesion was investigated for single-level elastomer fibrillar adhesives 30. The method used to make the fibers used to study the effect of the the backing layer 32 is different than the method of the present invention. However, the inventors believe that the effect of the thickness of the backing layer 32 is also applicable to the present invention, and the results of the study are presented below.

Polyurethane microfiber arrays 30 with spatulated tips 38 on a 160 μm thick backing layer 32 show nine times greater adhesion strength (around 22 N/cm²) than those with a 1120 μm thick backing 32. A theoretical model is proposed to explain this difference in which very thin backing layers 32 promote equal load sharing, maximizing adhesion, while very thick backings can lead to reduced adhesion due to edge stress concentration. Therefore, backing layer 32 thickness should be considered as a significant parameter for design of high performance fibrillar adhesives.

The adhesion of biologically inspired fibrillar dry adhesive has been studied extensively in combination with developments of various fabrication methods. Based on dominant forces of van der Waals [K. Autumn, M. Sitti, Y. A. Liang, A. M. Peattie, W. R. Hansen, S. Sponberg, T. W. Kenny, R. Fearing, J. N. Israelachvili, and R. J. Full. *Evidence for van der Waals adhesion in gecko setae*, PNAS, 99(19), 12252-12256 (2002)] and possibly capillary [G. Huber, H. Mantz, R. Spolenak, K. Mecke, K. Jacobs, S. N. Grob, and E. Artz, *Evicence for capillarity contributions to gecko adhesion from single spatula nanomechanical measurements*, PNAS, 102 (45), 16293-16296 (2005)] forces, vertical cylindrical micro/nanofiber arrays [A. K. Geim, S. V. Dubnos, I. V. Grigorieva, K. S. Novoselov, A. A. Zhukov, and S. Y. Shapoval, *Microfabricated adhesive mimicking gecko foot-hair. Nature Materials*, 2, 461-463 (2003)] were proposed as fibrillar adhesives at first. Design parameters for these fibers were proposed as the fiber radius, aspect ratio [C. Greiner, A. del Campo, and E. Arzt, *Adhesion of Bioinspired Micropatterned Surfaces: Effects of Pillar Radius, Aspect Ratio, and Preload Langmuir*, 23, 3495-3502 (2007)], tip shape [H. Gao and H. Yao, *Shape insensitive optimal adhesion of nanoscale fibrillar structures, PNAS*, 101(21), pages 7851-7856 (2004)], and material properties [K. Autumn, C. Majidi, R. E. Groff, A. Dittmore, and R. Fearing, *Effective elastic modulus of isolated gecko setal arrays, J. Exp. Biol.*, 209, 3558-3568 (2006)]. Inspired by footpads of various animals in nature such as insects and geckos, spatulated tips on single-level cylindrical [S. Kim and M. Sitti, *Biologically inspired polymer microfibers with spatulate tips as repeatable fibrillar adhesives, Applied Physics Letters*, 89, 261922-1-261911-3 (2006)] [N. J. Glassmaker, A. Jagota, C-Y. Hui, & J. Kim, *Design of biomimetic fibrillar interfaces:* 1. Making contact. J. R. Soc. Lond. Interface, 1-(1) 23-33 (2004)], angled [B. Aksak, M. P. Murphy, and M. Sitti, *Adhesion of Biologically Inspired Vertical and Angled Polymer Microfiber Arrays, Langmuir*, 23(6), 3322-3332 (2007)] and hierarchical [N. J. Glassmaker, A. Jagota, Hui, W. L. Noderer, M. K. Chaudhury, *Biologically inspired crack trapping for enhanced adhesion, PNAS*, 104, 10786-10791 (2007)] [A. del Campo and E. Arzt, *Design Parameters and Current Fabrication Approaches for Developing Bioinspired Dry Adhesives, Molecular Bioscience*, 7(2), 118-127 (2007)] fibers were introduced for developing high performance fibrillar adhesives. In addition, one of the recent findings demonstrates that the real contact perimeter is a more important geometrical factor governing adhesion than the real contact area [M. Varenberg, A. Peressadko, S. Gorb, and E. Arzt, *Effect of real contact geometry on adhesion, Applied Physics Letters*, 89, 121905-121905-3 (2006)]. However, the role of backing layer 32 thickness on adhesion has not been investigated in detail so far.

The backing layer 32 thickness effect on adhesion of elastomeric single-level microfiber structures 30 will now be described. Although a thick backing layer 32 improves the roughness adaptation and fiber 34 contact abilities due to increased effective compliance, this study shows that a thick backing layer 32 could reduce the macroscale adhesion of the fibers 34 on smooth surfaces significantly.

We measured the pull-off force of single-level elastomer fiber array 30 samples with different backing layer 32 thicknesses and developed a theoretical model to explain the observed results. Polyurethane (ST-1060, BJB Enterprise) fiber array 30 samples with spatulated tips 38 are fabricated using the procedure reported in S. Kim and M. Sitti. *Biologically inspired polymer microfibers with spatulate tips as repeatable fibrillar adhesives"*, Applied Physics Letters, 89, 261911-1-261911-3 (2006). Briefly, we first fabricate negative silicon fiber array templates using deep reactive ion etching. Liquid polyurethane 28 is filled into these silicon negative templates 26 and cured. The silicon templates 26 are then etched using $XeF_2$, and the fibers 34 are released. The final backing layer 32 thickness of each sample is determined by regulating the gap between the negative template 26 and a glass slide on it.

All fiber arrays 30 in our samples have a stem diameter of around five μm and a tip and base support diameter of nine μm. The total length of a fiber 34 is 20 μm and the minimum spacing between fiber centers is 12 μm as displayed in FIG.

13(a). A custom tensile setup was built to measure the adhesion of our samples. Our measure of adhesion in this work is the pull-off load. A silicon disk with 0.43 mm radius and nanometer scale surface roughness was fabricated by patterning a polished silicon (100) wafer using optical lithography and deep reactive ion etching. The silicon disk was attached to a load cell (Transducer Techniques, GSO-25), and moved vertically by a motorized stage (Newport, MFA-CC) with 100 nm resolution. The disk was contacted to and retracted from the fiber array sample with specified preload forces and a slow speed (1 μm/s) to minimize viscoelastic effects. The maximum pull-off force was recorded. In addition, the contact area and the deformation of fiber array 32 during loading and unloading was recorded using a camera (Dage-MTI, DC330) attached to an inverted optical microscope (Nikon, Eclipse TE200).

Adhesion of four samples with 160, 280, 630, and 1120 μm backing layer 32 thicknesses was measured and is shown in FIG. 13(b). Pull-off forces were measured at five different locations on each fiber array 30 for a preload of ten mN. The sample with the thinnest backing layer 32 (160 μm) showed the highest adhesion, with average pull-off force about nine times greater than that of the 1120 μm layer 32.

Figure 14:
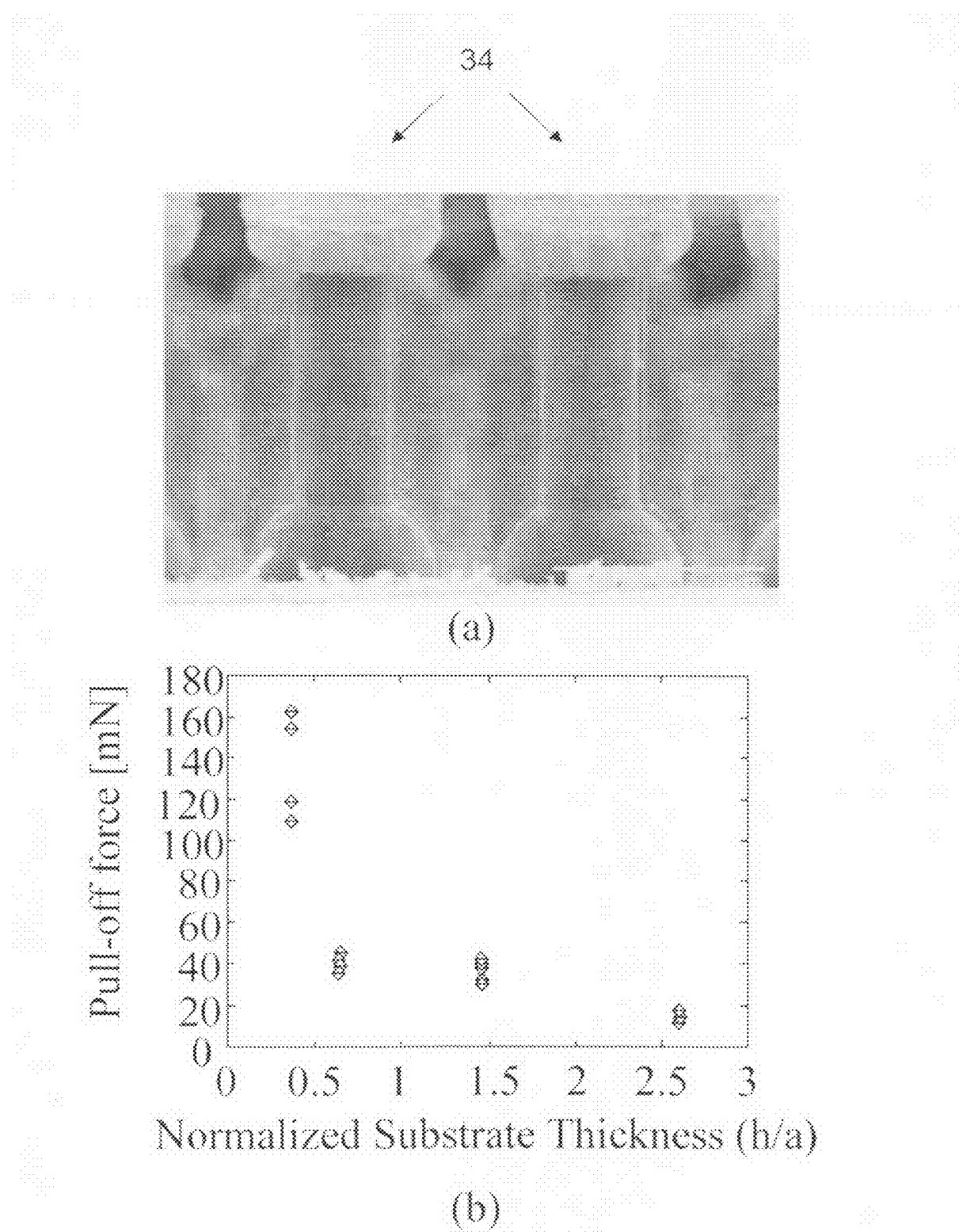
FIG. 14(a) illustrates a scanning electron microscope image of the profile view of a polyurethane elastomer microfiber array with spatulate tips with around 5 µm fiber stem diameter, 9 µm tip diameter, 20 µm length, and 44% fiber density.
FIG. 14(b) illustrates experimental pull-off force (adhesion) ($F_{ad}$) data for elastomer microfiber arrays on a silicon disk with 0.43 mm radius with four different normalized backing layer thicknesses (h/a) for a 10 mN preload (four data points were plotted for each backing thickness on different fiber array locations).

Our interpretation of this surprising finding, that reduced compliance enhances adhesion, lies in the idea that a thinner backing layer 32 promotes equal sharing of the load by the fibers 10. As shown schematically in FIG. 14(a), if a displacement δ were applied to three fibers 10 on an infinitesimally thin backing layer 32, each one would experience the same vertical tension, $F_{y1}$. If the fiber pulled-off at a characteristic force $F_f = k_f \delta_f$ where $k_f$ is the stiffness of the fiber 34 and $\delta_f$ is the fiber 34 elongation at pull-off, then the pull-off force of the system would be $3 F_f$. If the thin layer 32 were replaced by a very thick backing 32 (FIG. 14(b)), the y-direction forces would be $F_{y1} = k_f \delta$ and $F_{y2} = k_f \delta + F_B$ where $F_B$ is the additional force required to keep the tip 38 attached to the disk due to non-uniform deformation of the backing layer 32. Because the backing layer 32 is elastic, $F_B = \alpha k_f \delta$ for some positive α. The two fibers 34 on the side will pull-off when $k_f \delta + F_B = F_f$ and the total force at pull-off would be $(3-\alpha)F_f$.

To quantify this idea for a large number of fibers 34 in contact, we note that the spacing of the fibers 34 are typically very small in comparison with the contact radius a and the thickness of the elastic layer h. Hence, we can treat these fibers 34 as a foundation consisting of elastic springs between the rigid indenter and the backing layer 32. The foundation can support a normal stress σ, which is related to the displacement of foundation, d by σ=kd where k is the stiffness of the foundation. Note that d is the difference in normal displacement between the surface of the indenter and the backing layer 32. The stiffness can be determined by assuming that the fibers 34 are bars with height L and effective cross-sectional area $A_{eff}$, $k=\rho E A_{eff}/L$ where ρ is the number of fibrils per unit area. From the known geometry and stiffness of our fibers, $k=2.37 \times 10^{-10}$ N/m³ where $\rho=1/(12 \times 10^{-6})^2$ fibers/m², $E=3$ MPa, $A_{eff}=\pi r^2$, r=2.5 μm, and L=14 μm.

The maximum pull-off force occurs in the equal load sharing (ELS) regime, where all the fibers in adhesive contact with the indenter bear the same load. To see how ELS depends on the backing layer thickness and the contact area, assume that all the fibers in contact are in this regime, so at pull-off, we have $$\sigma_f = k \delta_f \quad (2)$$

In the ELS limit, the maximum pull-off force $F_{max}$ is directly proportional to the contact area, $$F_{max} = \pi a^2 \sigma_f \quad (3)$$

where a is the radius of the disk. The ELS limit is strictly valid if the backing layer thickness h is very small compared to a. Another limit is a very thick backing layer 32 with very stiff fibers 34, that is, when h/a→∞ and α≡ka/2G is very large where G is the shear modulus. In this limit, the interfacial displacement is dominated by the deformation of the elastic layer and the stress distribution is given by the classical solution of a rigid punch in contact with a half space [K. L. Johnson, *Contact Mechanics*, Cambridge University Press (1985)]. The normal stress at the punch edge has a square root singularity characteristic of an opening crack. For α>>1 and h/a>>1, the pull-off force $F_{ad}$ in this limit can be derived as $$F_{ad} = \frac{4 F_{max}}{\sqrt{2\pi\alpha}}. \quad (4)$$

This equation shows that, given $F_{max}$, the maximum extent of strength reduction can be predicted. The data in FIG. 13(b) show a decrease in pull-off force with increasing thickness. Theoretically, in the limit of very small thickness, pull-off force should asymptotically approach the ELS limit, which depends on the unknown fiber pull off stress, $\sigma_f$. In this limit, the pull-off load is significantly affected by variability in $\sigma_f$. This is reflected in the scatter of the pull-off force data associated with the sample with the smallest h/a.

The theoretical problem of determining pull-off forces as a function of α and h/a is more involved and will be addressed in a future work. In summary, polyurethane fiber arrays 30 with spatulated tips 38 on 160 μm thick backing layer 32 show adhesion strength (around 22 N/cm²), nine times greater than fiber arrays 30 with thickness of 1120 μm. A theoretical model is proposed to explain this difference in which very thin backing layers 32 promote equal load sharing, maximizing adhesion. In the other extreme, very thick backings 32 can lead to reduced adhesion, because of edge stress concentration similar to a rigid punch in adhesive contact with a half space. This work shows the significance of backing layer 32 thickness on equal load sharing of single-level fiber arrays 30 on smooth surfaces. The same thickness effect is expected to happen for micro/nanoscale rough surfaces also.

Although the present invention has generally been described in terms of making several fibers 34 attached to a backing layer 32, the present invention may also be used to make a single fiber 10, or to make a plurality of fibers 34 that are not connected to a backing layer 32. Furthermore, the present invention may also include two or more layers of fibers 34 or fiber arrays 30 having two or more layers of fibers 34. One embodiment will be described below.

FIGS. 16a-16e illustrate one embodiment of making multilayer fibers and fiber arrays according to the present invention. Although this embodiment will be described as using SU-8 photoresist, other embodiments of the present invention may use other kinds of photoresist as well as materials other than photoresist.

Figure 16A:
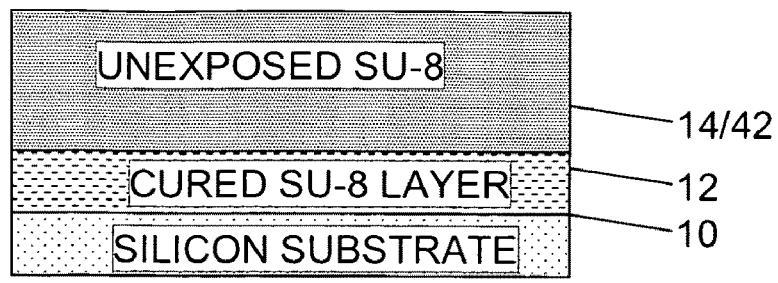
FIGS. 16a-16e illustrate one embodiment of making multi-layer fibers and fiber arrays according to the present invention.

FIG. 16a illustrates a structure similar to that described with reference to FIG. 1a. A thin layer of SU8 photoresist is spun onto a substrate 10 and is processed to form a backing layer 12. After a post-exposure-bake, another layer of SU8 photoresist 14/42 is spun above the first layer 12.

Figure 16B:
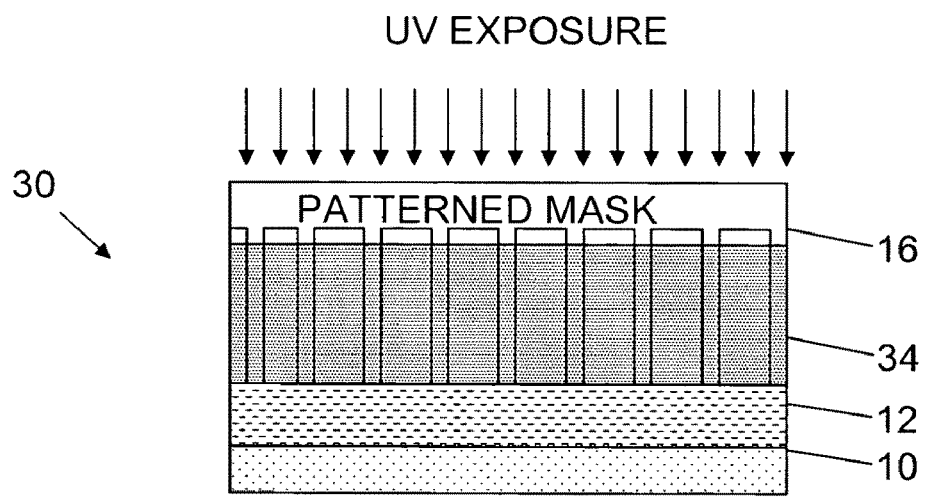

FIG. 16b illustrates the additional layer of SU8 photoresist 14/42 is baked and then exposed to ultraviolet or other energy via a circular array pattern 16 to form the base fibers 34. These fibers 34 can be vertical or angled. Exposing the wafer to the ultraviolet or other energy at a non-orthogonal angle creates the angled fibers 34. Again the wafer is heated to cure the layer.

Figure 16C:
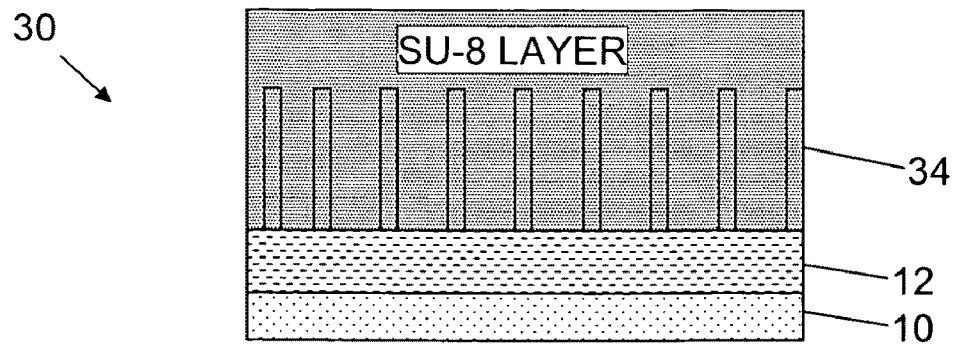

FIG. 16c illustrates a last thin layer 50 of SU-8 is spun on top of the first two layers 12, 14. This last layer 50 will become the second layer of fibers.

Figure 16D:
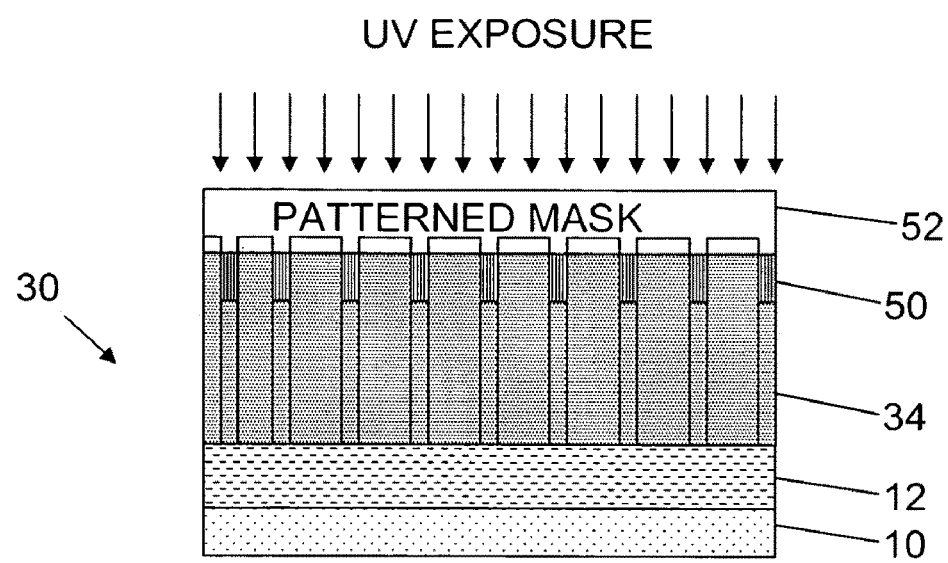

FIG. 16d illustrates the processing of the material 50 that will become the second layer of fibers. In particular, in this embodiment the top layer 50 is heated and then exposed through a mask 52 with smaller features than the previous exposure, forming smaller fibers 54 atop the base fibers 34. This step can be done by aligning the masks 16, 52, or by using a uniform mask since the second layer of fibers 54 are thinner than the first layer of fibers 34, and will not form all the way down to the surface, and will be developed away everywhere except for at the tops of the base fibers 34.

Figure 16E:
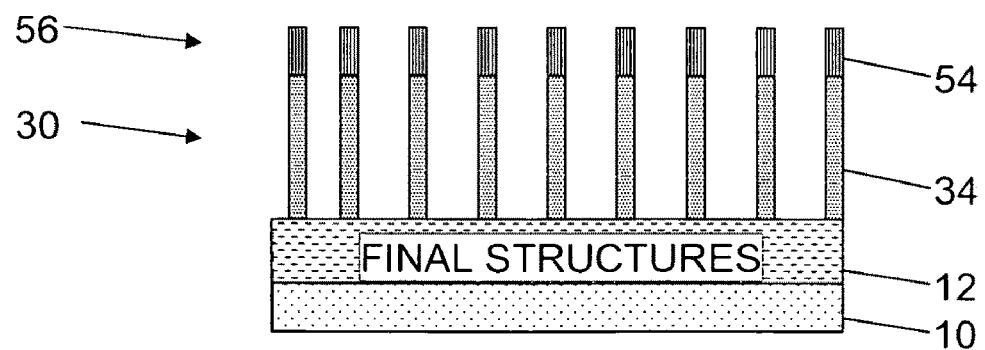

FIG. 16e illustrates the structure after being placed in the developing solution which removes the unexposed (or exposed but unanchored) material, resulting in the desired hierarchical structures. In particular, a second dry adhesive structure 56 is formed on top of the first dry adhesive structure 30. The second layer dry adhesive structure 56 may be formed on the top surfaces 36 of the fibers 34 in the first layer dry adhesive structure 30, or the second layer dry adhesive structure 56 may be formed on the sides of the fibers 34 in the first layer dry adhesive structure 30.

Figure 17A:
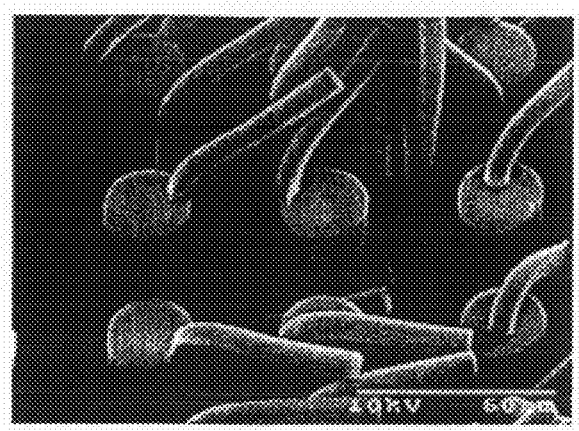
FIGS. 17a-17c illustrate scanning electron microscope images of multi-layer fibers and fiber arrays fabricated according to the present invention.
Figure 17B:
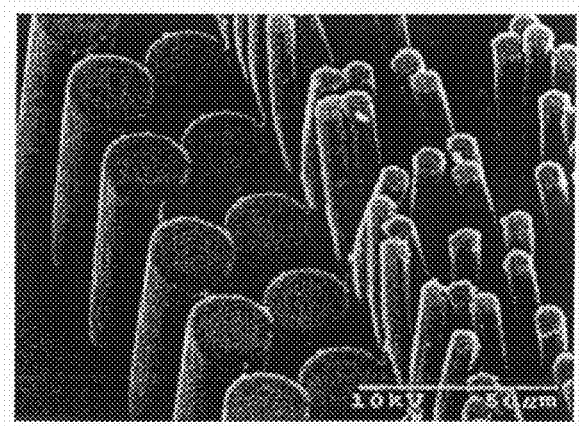
Figure 17C:
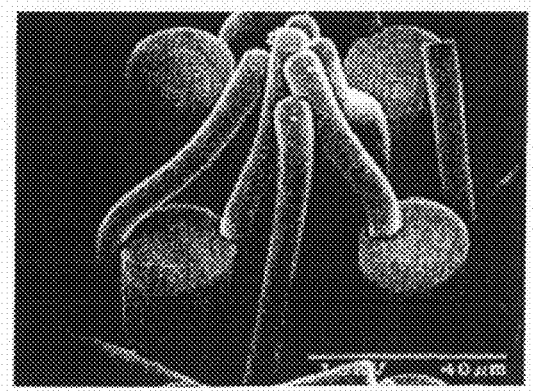

FIGS. 17a-17c illustrate scanning electron microscope images of multi-layer fibers 34 and fiber arrays 30 fabricated according to the present invention.

FIG. 17a illustrates thinner second layer fibers 54 formed on the tops (or near the tops) of the thicker, first layer fibers 34. In this embodiment, most of the first layer fibers 34 contain only one second layer fiber 54, although the present invention may be used to make first layer fibers 34 having many second layer fibers 54.

FIG. 17b illustrates an array of first layer fibers 34 having no second layer fibers 54, and an array of second layer fibers having many second layer fibers 54.

FIG. 17c illustrates second layer fibers 54 clumping together.

Although the present invention has been described in terms of a two layer fiber array 30, the present invention may also be used to produce a fiber array 30 having more than two layers. In addition, the present invention is not limited to multilayer fiber arrays 30, and it may also be used, for example, to make multilayer individual fibers 34 and to make other structures.

Although the present invention has generally been described in general terms and in terms of specific embodiments and implementations, the present invention is applicable to other methods, apparatuses, systems, and technologies. The examples provided herein are illustrative and not limiting, and other variations and modifications of the present invention are contemplated, such as any other thick or thin photoresist can be used as the photosensitive polymer to form fibers, X-ray can be used instead of ultraviolet light to pattern the photoresist polymer to form higher angled (0-80 degrees) and smaller diameter fibers (down to tens of nanometer scale), the similar angled fibers could be used as directional friction materials where the friction is higher in one direction than the other direction (this directional friction property is important for assembly line treads, climbing robots and tires type of applications), and the similar angled fibers could be used as a coating where droplet(s) could be moved on these structures in a directional way for liquid droplet transfer. Other variations are also possible. For example, although the present invention was generally described in terms of fibers having conical shapes illustrated with circular cross-sections, fibers having other shapes may also be made with the present invention. Those and other variations and modifications of the present invention are possible and contemplated, and it is intended that the foregoing specification and the following claims cover such modifications and variations.

The invention claimed is:

1. A method of forming a template structure comprising polymer micro- and nanofiber arrays, comprising the steps performed in the following sequence:
    forming a template backing layer of photo- or x-ray sensitive polymer material on a substrate;
    forming a template layer of photo- or x-ray sensitive polymer material on the template backing layer, wherein the template layer is a first dry adhesive layer;
    exposing the template layer to a predetermined pattern of energy;
    removing a portion of the template layer related to the predetermined pattern of energy, and leaving the template structure formed from the photo- or x-ray sensitive polymer material and connected to the substrate via the template backing layer, wherein the template structure is a dry adhesive structure comprising polymer micro- and nanofiber arrays;
    forming a layer of photo- or x-ray sensitive polymer material on the dry adhesive structure;
    exposing the layer of photo- or x-ray sensitive polymer material on the dry adhesive structure to a predetermined pattern of energy; and
    removing a portion of the layer of photo- or x-ray sensitive polymer material on the dry adhesive structure related to the predetermined pattern of energy, and leaving a second dry adhesive structure formed from the photo- or x-ray sensitive polymer material and connected to the dry adhesive structure comprising polymer micro- and nanofiber arrays.

2. A method of forming a dry adhesive structure, comprising the steps performed in the following sequence:
    forming a template backing layer of photo- or x-ray sensitive polymer material on a substrate;
    forming a template layer of photo- or x-ray sensitive polymer material on the template backing layer;
    exposing the template layer to a predetermined pattern of energy;
    removing a portion of the template layer related to the predetermined pattern of energy, and leaving a template structure formed from the photo- or x-ray sensitive polymer material and connected to the substrate via the template backing layer;
    providing a mold material in the template structure, wherein the mold material is different from the photo- or x-ray sensitive polymer material of the template structure;
    allowing the mold material to form a mold structure which is complimentary to the template structure;
    separating the mold structure from the template structure;
    filling the mold structure with a dry adhesive material;
    allowing the dry adhesive material to form a dry adhesive structure corresponding which is complimentary to the mold structure, wherein the dry adhesive structure comprises polymer micro- and nanofiber arrays; and
    separating the mold structure and the dry adhesive structure.

3. The method of claim 2, wherein filling the mold structure with the dry adhesive material includes forming the template backing layer connected to the dry adhesive material in the mold structure.

4. The method of claim 3, wherein the template backing layer is not within the mold structure.

5. The method of claim 3, wherein the template backing layer is made from dry adhesive material.

6. The method of claim 1, wherein exposing the template layer to the predetermined pattern of energy includes exposing the template layer to the predetermined pattern of energy that is oriented orthogonally to the substrate.

7. The method of claim 1, wherein exposing the template layer to the predetermined pattern of energy includes exposing the template layer to the predetermined pattern of energy that is oriented obliquely to the substrate.

8. The method of claim 1, wherein the template backing layer is photoresist.

9. The method of claim 8, wherein the template backing layer is SU-8 photoresist.

10. The method of claim 1, wherein the template layer is photoresist.

11. The method of claim 10, wherein the template layer is SU-8 photoresist.

12. The method of claim 1, further comprising after forming the template backing layer of photo- or x-ray sensitive polymer material on the substrate and before forming the template layer of photo- or x-ray sensitive polymer material on the template backing layer: exposing the template backing layer to uniform ultraviolet light.

13. The method of claim 12, wherein forming the template backing layer comprises the steps performed in the following sequence:
   heating the template backing layer at a first temperature and maintaining the template backing layer at the first temperature;
   heating the template backing layer at a second temperature and maintaining the template backing layer at the second temperature, wherein the second temperature is greater than the first temperature;
   cooling the template backing layer;
   exposing the template backing layer to ultraviolet light;
   heating the template backing layer to a third temperature and maintaining the template backing layer at the third temperature;
   heating the template backing layer to a fourth temperature and maintaining the template backing layer at the fourth temperature, wherein the fourth temperature is greater than the third temperature; and
   cooling the template backing layer.

14. The method of claim 13, wherein: the first temperature is approximately 65 C.; the second temperature is approximately 95 C.; the third temperature is approximately 65 C.; and the fourth temperature is approximately 95 C.

15. The method of claim 14, wherein:
   maintaining the template backing layer at the first temperature includes maintaining the template backing layer at the first temperature for approximately one minute;
   maintaining the template backing layer at the second temperature includes maintaining the template backing layer at the second temperature for approximately two minutes;
   maintaining the template backing layer at the third temperature includes maintaining the template backing layer at the third temperature for approximately one minute; and
   maintaining the template backing layer at the fourth temperature includes maintaining the template backing layer at the fourth temperature for approximately one minute.

* * * * *